(12) United States Patent
Hering et al.

(10) Patent No.: US 8,093,492 B2
(45) Date of Patent: *Jan. 10, 2012

(54) SOLAR CELL RECEIVER FOR CONCENTRATED PHOTOVOLTAIC SYSTEM FOR III-V SEMICONDUCTOR SOLAR CELL

(75) Inventors: Gary Hering, Bolle Mead, NJ (US); Mikhail Kats, Rockaway, NJ (US); Alan Gorenz, Albuquerque, NM (US); Scott Elman, Monroe Township, NJ (US); Lu Fang, Albuquerque, NM (US)

(73) Assignee: Emcore Solar Power, Inc., Albuquerque, NM (US)

( * ) Notice: Subject to any disclaimer, the term of this patent is extended or adjusted under 35 U.S.C. 154(b) by 803 days.

This patent is subject to a terminal disclaimer.

(21) Appl. No.: 12/069,642

(22) Filed: Feb. 11, 2008

(65) Prior Publication Data

US 2009/0199890 A1 Aug. 13, 2009

(51) Int. Cl.
*H01L 31/05* (2006.01)
(52) U.S. Cl. ..................................... 136/256
(58) Field of Classification Search .............. 136/246, 136/256
See application file for complete search history.

(56) References Cited

U.S. PATENT DOCUMENTS

| | | |
|---|---|---|
| 3,589,946 A | 6/1971 | Krishnan et al. |
| 3,811,954 A | 5/1974 | Lindmayer |
| 3,966,499 A | 6/1976 | Yasui et al. |
| 3,999,283 A | 12/1976 | Dean et al. |
| 4,017,332 A | 4/1977 | James |
| 4,109,640 A | 8/1978 | Smith |
| 4,164,432 A | 8/1979 | Boling |
| 4,168,696 A | 9/1979 | Kelly |
| 4,186,033 A | 1/1980 | Boling |
| 4,188,238 A | 2/1980 | Boling |
| 4,191,593 A | 3/1980 | Cacheux |
| 4,268,709 A | 5/1981 | Boling |
| 4,292,959 A | 10/1981 | Coburn, Jr. |
| 4,329,535 A | 5/1982 | Rapp |
| 4,574,659 A | 3/1986 | Arndt |
| 4,585,318 A | 4/1986 | Seifert |
| 4,834,805 A | 5/1989 | Erbert |
| 5,091,018 A | 2/1992 | Fraas et al. |
| 5,096,505 A | 3/1992 | Fraas et al. |

(Continued)

FOREIGN PATENT DOCUMENTS

DE 26 07 005 C2 9/1976

(Continued)

OTHER PUBLICATIONS

Aiken, D., et al., *A Loss Analysis for a 28% Efficient 520X Concentrator Module*; Photovoltaic Energy Conversion, Conference Record of the 2006 IEEE 4th World Conference on Publication Date: May 2006, vol. 1, On pp. 686-689.

(Continued)

*Primary Examiner* — Jennifer Michener
*Assistant Examiner* — Dustin Q Dam

(57) ABSTRACT

A solar cell module comprises an array of lenses, corresponding secondary optical elements and corresponding solar cell receivers. The solar cell receiver includes a solar cell having one or more III-V compound semiconductor layers, a diode coupled in parallel with the solar cell and connector for coupling to other solar cell receivers. The module includes a housing that supports the lenses such that each lens concentrates solar energy onto its respective solar cell.

15 Claims, 7 Drawing Sheets

U.S. PATENT DOCUMENTS

| | | |
|---|---|---|
| 5,118,361 A | 6/1992 | Fraas et al. |
| 5,153,780 A | 10/1992 | Jorgensen et al. |
| 5,167,724 A | 12/1992 | Chiang |
| 5,217,539 A | 6/1993 | Fraas et al. |
| 5,255,666 A | 10/1993 | Curchod |
| 5,374,317 A | 12/1994 | Lamb et al. |
| 5,409,550 A | 4/1995 | Safir |
| 5,460,659 A | 10/1995 | Krut |
| 5,616,185 A * | 4/1997 | Kukulka ............... 136/244 |
| 5,622,078 A | 4/1997 | Mattson |
| 5,660,644 A | 8/1997 | Clemens |
| 5,936,777 A | 8/1999 | Dempewolf |
| 5,959,787 A | 9/1999 | Fairbanks |
| 5,977,478 A | 11/1999 | Hibino et al. |
| 6,020,555 A | 2/2000 | Garboushian et al. |
| 6,031,179 A | 2/2000 | O'Neill |
| 6,043,425 A | 3/2000 | Assad |
| 6,057,505 A | 5/2000 | Ortabasi |
| 6,080,927 A | 6/2000 | Johnson |
| 6,091,020 A | 7/2000 | Fairbanks et al. |
| 6,252,155 B1 | 6/2001 | Ortabasi |
| 6,331,670 B2 | 12/2001 | Takehara et al. |
| 6,399,874 B1 | 6/2002 | Olah |
| 6,469,241 B1 | 10/2002 | Penn |
| 6,483,093 B1 | 11/2002 | Takemura et al. |
| 6,603,069 B1 | 8/2003 | Muhs et al. |
| 6,617,508 B2 * | 9/2003 | Kilmer et al. ............. 136/252 |
| 6,680,432 B2 | 1/2004 | Sharps et al. |
| 6,700,054 B2 | 3/2004 | Cherney et al. |
| 6,700,055 B2 | 3/2004 | Barone |
| 6,730,840 B2 | 5/2004 | Sasaoka et al. |
| 6,799,742 B2 | 10/2004 | Nakamura et al. |
| 6,804,062 B2 | 10/2004 | Atwater et al. |
| 6,903,261 B2 | 6/2005 | Habraken et al. |
| 6,959,993 B2 | 11/2005 | Gross et al. |
| 7,119,271 B2 | 10/2006 | King et al. |
| 7,192,146 B2 | 3/2007 | Gross et al. |
| 7,238,879 B2 | 7/2007 | Matsushita et al. |
| 7,244,998 B2 | 7/2007 | Nakata |
| 7,381,886 B1 | 6/2008 | Aiken et al. |
| 7,671,270 B2 * | 3/2010 | Fang ........................ 136/255 |
| 2001/0006066 A1 | 7/2001 | Cherney et al. |
| 2002/0066828 A1 | 6/2002 | Nakamura et al. |
| 2002/0117675 A1 | 8/2002 | Mascarenhas |
| 2002/0139415 A1 | 10/2002 | Shimizu et al. |
| 2002/0148497 A1 | 10/2002 | Sasaoka et al. |
| 2003/0015233 A1 | 1/2003 | Barone |
| 2003/0121542 A1 | 7/2003 | Harneit et al. |
| 2004/0031517 A1 | 2/2004 | Bareis |
| 2004/0084077 A1 | 5/2004 | Aylaian |
| 2004/0112424 A1 | 6/2004 | Araki et al. |
| 2004/0134531 A1 | 7/2004 | Habraken et al. |
| 2004/0173257 A1 | 9/2004 | Rogers et al. |
| 2004/0194820 A1 | 10/2004 | Barone |
| 2004/0261838 A1 | 12/2004 | Cotal et al. |
| 2005/0034751 A1 | 2/2005 | Gross et al. |
| 2005/0034752 A1 | 2/2005 | Gross et al. |
| 2005/0048310 A1 | 3/2005 | Cocchi et al. |
| 2005/0081908 A1 | 4/2005 | Stewart |
| 2005/0081909 A1 | 4/2005 | Paull |
| 2005/0092360 A1 | 5/2005 | Clark |
| 2005/0109386 A1 | 5/2005 | Marshall |
| 2005/0145274 A1 | 7/2005 | Polce et al. |
| 2006/0042650 A1 | 3/2006 | Ochs |
| 2006/0054211 A1 | 3/2006 | Meyers |
| 2006/0119305 A1 | 6/2006 | Lee et al. |
| 2006/0130892 A1 | 6/2006 | Algora |
| 2006/0185726 A1 | 8/2006 | Rogers et al. |
| 2006/0249198 A1 | 11/2006 | Rhee |
| 2006/0283497 A1 | 12/2006 | Hines |
| 2007/0034250 A1 | 2/2007 | Dutta |
| 2007/0044833 A1 | 3/2007 | Chern et al. |
| 2007/0089777 A1 | 4/2007 | Johnson et al. |
| 2007/0095385 A1 | 5/2007 | Shin et al. |
| 2007/0188876 A1 | 8/2007 | Hines et al. |
| 2007/0193620 A1 | 8/2007 | Hines et al. |
| 2007/0199563 A1 | 8/2007 | Fox |
| 2007/0227581 A1 | 10/2007 | Chen et al. |
| 2007/0246040 A1 | 10/2007 | Schaafsma |
| 2008/0128586 A1 | 6/2008 | Johnson et al. |
| 2008/0308154 A1 | 12/2008 | Cart et al. |
| 2009/0000662 A1 | 1/2009 | Harwood et al. |
| 2009/0032092 A1 | 2/2009 | Fang |
| 2009/0032093 A1 | 2/2009 | Fang |
| 2010/0018570 A1 | 1/2010 | Cashion et al. |
| 2010/0032004 A1 | 2/2010 | Baker et al. |
| 2010/0037935 A1 * | 2/2010 | Vaid et al. ................ 136/246 |
| 2010/0139752 A1 * | 6/2010 | Fang ......................... 136/255 |

FOREIGN PATENT DOCUMENTS

| | | |
|---|---|---|
| DE | 26 07 509 A1 | 9/1977 |
| DE | 29 24 510 A1 | 1/1981 |
| DE | 196 09 283 A1 | 9/1997 |
| DE | 102004050638 | 2/2006 |
| DE | 10 2005 000 767 A1 | 7/2006 |
| DE | 10 2005 047 132 A1 | 4/2007 |
| DE | 10 2008 012 335 A1 | 3/2009 |
| EP | 1469528 | 10/2004 |
| EP | ITMI20071833 | 12/2007 |
| EP | 0 657 948 B1 | 2/2008 |
| JP | 2000-196127 | 7/2000 |
| JP | 2000-223730 | 8/2000 |
| JP | 2006-344698 * | 12/2006 |
| KR | 2003002105 | 1/2003 |
| WO | 89/05463 A1 | 6/1989 |
| WO | 91/18419 | 11/1991 |
| WO | 91/18420 | 11/1991 |
| WO | WO2005/048310 | 5/2005 |
| WO | WO2006042650 | 2/2006 |
| WO | WO2006/119305 | 9/2006 |

OTHER PUBLICATIONS

Aiken, D.J. et al., *Consideration of High Bandgap Subcells for Advanced Multijunction Solar Cells* Photovoltaic Energy Conversion, Conference Record of the 2006 IEEE 4th World Conference on vol. 1, May 2006 pp. 838-841.

Aiken, D., et al., *Delivering Known Good Die: High Volume Testing of Multi-junction Solar Cells for Use In Terrestrial Concentrator Systems*, International Concentrator Conference, El Escorial, Spain, 2007 (available at www.emcore.com (last visited Nov. 1, 2007).

Aiken, D., et al., *Temperature Dependent Spectral Response Measurements for III-V Multi-junction Solar Cells*, 29th IEEE PVSC, 2002, p. 828.

Aiken, D., et al.; *Development and testing of III-V multijunction-based terrestrial concentrator modules*; Conference Record of the Thirty-First IEEE Photovoltaic Specialist Conference; 2005; pp. 743-746.

Aiken, D.J., et al., *Design, Manufacturing, and Testing of a Prototype Multijunction Concentrator Module*, International Concentrator Conference, Arizona, 2005.

Algora, C., et al.; *III-V concentrator solar cells as LEDs*; III-Vs Rev., vol. 18, No. 6, Aug. 2005, pp. 40-42.

Algora, C., et al.; *Strategic options for a LED-like approach in III-V concentrator photovoltaics*; Conference Record of the 2006 IEEE 4th World Conference on Photovoltaic Energy Conversion; 2006; pp. 4.

Andreev, V.M. et al; *Tunnel diode revealing peculiarities at I-V measurements in multijunction III-V solar cells*; Conference Record of the 2006 IEEE 4th World Conference on Photovoltaic Energy Conversion; 2006; pp. 4.

Araki, K., et al., *Development of a new 550X concentrator module with 3J cells—performance and reliability*; Conference Record of the Thirty-First IEEE Photovoltaic Specialist Conference; 2005; pp. 631-634.

Araki, K., et al., *Development of concentrator modules with dome-shaped Fresnel lenses and triple-junction concentrator cells*; Prog. Photovolt., Res. Appl.; vol. 13, No. 6; Sep. 2005 pp. 513-527.

Araki, K., et al., *Packaging III-V tandem solar cells for practical terrestrial applications achievable to 27% of module efficiency by conventional machine assemble technology*; Sol Energy Mater. Sol. Cells; vol. 90; No. 18-19; Nov. 23, 2006; pp. 3320-3326.

Araki, K.et al.; *A small sun in an ETUI: possibilities in HCPV*; Conference Record of the 2006 IEEE 4th World Conference on Photovoltaic Energy Conversion (IEEE Cat. No. 06CH37747) 2006; pp. 6.

Araki, Kenji; et at ; *Achievement of 27% efficient and 200 Wp concentrator module and the technological roadmap toward realization of more than 31% efficient modules*; Sol Energ Mater Sol Cells ; vol. 90 , No. 18-19 , Nov. 23, 2006 , pp. 3312-3319.

Balenzategui, J. L., et al.; *Design of hemispherical cavities for LED-based illumination devices* Applied Physics B (Lasers and Optics) vol . B82 , No. 1Jan. 2006 , pp. 75.

Ballard, I.M., et al.; *Progress in quantum well solar cells*; Thin Solid Films , vol. 511-512 ; Jul. 26, 2006 , pp. 76-83.

Baudrit, M., et al.; *3D modeling of concentrator III-V multi junction solar cells*; Conference Record of the 2006 IEEE $4^{th}$ World Conference on Photovoltaic Energy Conversion; 2006; pp. 4.

Baudrit, M., et al.; *III-V concentrator solar cells simulation: a 2D/3D approach for the design and optimization*; 2005 Spanish Conference on Electron Devices; 2005; pp. 365-368.

Baudrit, M., et al.; *Numerical analysis of GaInP solar cells: toward advanced photovoltaic devices modeling*; NUSOD' 05; Proceedings of the $5^{th}$ International Conference on Numerical Simulation of Optoelectronic Devices; 2005; pp. 41-42.

Baur, C., et al., *Triple junction III-V based concentrator solar cells: Perspectives and challenges*; J Sol Energy Eng Trans ASME; vol. 129; No. 3; Aug. 2007; pp. 258-265.

Bett, A.W., et al.; *High-concentration PV using III-V solar cells*; Conference Record of the 2006 IEEE 4th World Conference on Photovoltaic Energy Conversion; 2006; pp. 6.

Brandhorst, H. W., Jr., et al.; *The past, present and future of space photovoltaics*; Conference Record of the 2006 IEEE 4th World Conference on Photovoltaic Energy Conversion (IEEE Cat. No. 06CH37747) ; 2006 ; pp. 6 pp. CD-ROM.

Charache, G.W., et al, *Moss-Burstein and Plasma Reflection Characteristics of Heavily Doped n-type InxGa1-xAs and InPyAs1-y*, J. Apl. Phys. 86, 1999, 452.

*Conference Record of the 2006 IEEE 4th World Conference on Photovoltaic Energy Conversion* (IEEE Cat. No. 06CH37747) May 7-12, 2006.

Cotal, H., et al., *Outdoor Operation of GaInP/GaAs/Ge Triple Junction Concentrator Solar Cells Up to 1000 Suns*, $3^{rd}$ World Conference on Photovoltaic Energy Conversion. Osaka, Japan, May 11-18, 2003 825-828.

Cotal, H., et al., *Temperature dependence of the IV parameters from triple junction GaInP/InGaAs/Ge concentrator solar cells*; Conference Record of the 2006 IEEE $4^{th}$ World Conference on Photovoltaic Energy Conversion; 2006; pp. 4.

Cotal, H., et al., *The effects of chromatic aberration on the performance of GaInP/GaAs/Ge concentrator solar cells from Fresnel optics*; Conference Record of the Thirty-First IEEE Photovoltaic Specialist Conference; 2005; pp. 747-750.

Dimroth, F. et al., *High-efficiency solar cells from III-V compound semiconductors*; Phys. Status Solid. C; 2006; pp. 373-379.

Dimroth, F., et al. *3-6 junction photovoltaic cells for space and terrestrial concentrator applications*; Conference Record of the Thirty-First IEEE Photovoltaic Specialist Conference; 2005; pp. 525-529.

Dimroth, F., et al. *Hydrogen production in a PV concentrator using III-V multi-junction solar cells*; Conference Record of the 2006 IEEE 4th World Conference on Photovoltaic Energy Conversion; 2006; pp. 4.

Dominguez, C., et al., *Spectral characterization of mini concentrator optics for its use with MJ cells*; Conference Record of the 2006 IEEE 4th World Conference on Photovoltaic Energy Conversion; 2006; pp. 4.

Faiman, D., et al., *Natural sunlight tests at PETAL, of a trial MIM string at concentrations up to 1000X*; Conference Record of the 2006 IEEE 4th World Conference on Photovoltaic Energy Conversion; 2006; pp. 4.

Fatemi, N. S., et al. , *Production of Very High-Efficiency Advanced Triple-Junction (ATJ) Space Solar Cells at Emcore Photovoltaics*, presented at the 2003 Space Power Workshop, Torrance, CA.

Feltrin, A., et al., *Material challenges for terawatt level deployment of photovoltaics*; Conference Record of the Thirty-First IEEE Photovoltaic Specialist Conference; 2006; pp. 4.

Flores, C., et al. *GaAs Solar Cells on Si Substrates for Concentrator Systems*; European Photovoltaic Solar Energy Conference -CD-ROM Edition- pp. 1CO.4.4 ; 2005.

Fraas, L. M., et al., *Toward 40% Efficient Mechanically Stacked III-V Terrestrial Concentrator Cells*; Conference Record of the IEEE Photovoltaic Specialists Conference ; vol. 31 , 2005 , pp. 751-753.

Fraas, L., et al., *Demonstration of a 33% efficient Cassegrainian solar module*; Conference Record of the 2006 IEEE 4th World Conference on Photovoltaic Energy Conversion; 2006; pp. 4.

Gabetta, G., et al., *SJ and TJ GaAs concentrator solar cells on Si virtual wafers*; Conference Record of the Thirty-First IEEE Photovoltaic Specialist Conference; 2005; pp. 850-853.

Galiana, B. et al., *Comparison of 1D and 3D analysis of the front contact influence on GaAs concentrator solar cell performance*; Sol. Energy Mater. Sol. Cells, vol. 90, No. 16, Oct. 16, 2006, pp. 2589-2604.

Galiana, B., et al., *Influence of nucleation layers on MOVPE grown GaAs on Ge wafers for concentrator solar cells*; Conference Record of the 2006 IEEE 4th World Conference on Photovoltaic Energy Conversion 2006, pp. 4.

Galiana, B., et al.; *A 3-D model for concentrator solar cells based on distributed circuit units*; IEEE Trans. Electron Devices; vol. 52; No. 12; Dec. 2005; pp. 2552-2558.

Galiana, B., et al.; *A comparative study of BSF layers for GaAs-based single-junction or multijunction concentrator solar cells*; Semiconductor Science and Technology , vol. 21; No. 10 Oct. 2006 ; pp. 1387-1392.

Garboushian, V. et al., *A Novel High-Concentration PV Technology for Cost Competitive Utility Bulk Power Generation*; Proc. $1^{st}$ World Conference on Photovoltaic Energy Conversion. 1994 1060-1063.

Garcia, I., et al., *Choices for the epitaxial growth of GaInP/GaAs dual junction concentrator solar cells*; 2005 Spanish Conference on Electron Devices; 2005, pp. 251-254.

Garcia, I., et al.; *Specific growth and characterization issues in multi-junction solar cells for concentrations above 1000 suns*; Conference Record of the 2006 IEEE 4th World Conference on Photovoltaic Energy Conversion (IEEE Cat. No. 06CH37747) 2006, pp. 4.

Gonzalez, J.R., et al.; *Analysis of the degradation of high concentrator III-V solar cells*; 2005 Spanish Conference on Electron Devices. 2005; pp. 33-36.

Imaizumi, M., et al.; *InGaP/GaAs-based multijunction solar cells*; Prog Photovoltaics Res Appl; vol. 13, No. 6; Sep. 2005; pp. 495-511.

Khuchua, N. P., et al.; *2005 Prospects for GaAs Solar Cells with a New Type Concentrator* European Photovoltaic Solar Energy Conference pp. 1BV.2.13.

King, R.R., et al., *40% efficient metamorphic GaInP/GaInAs/Ge multijunction solar cells*; Appl. Phys. Lett. vol. 90, No. 18, Apr. 30, 2005, pp. 183516-1-3.

King, R.R., et al., *Metamorphic and lattice-matched solar cells under concentration*; Conference Record of the 2006 IEEE $4^{th}$ World Conference on Photovoltaic Energy Conversion; 2006; pp. 4.

Kinsey, G.S., et al.; *Multijunction solar cells for dense-array concentrators*; Conference Record of the 2006 IEEE $4^{th}$ World Conference on Photovoltaic Energy Conversion; 2006; pp. 3.

Kurtz, S., et al. *A New GaInP/GaAs/GaInAs, Triple-Bandgap, Tandem Solar Cell for High-Efficiency Terrestrial Concentrator Systems* ; Report No. NREL/CP-520-38997; Nov. 1, 2005 5 pp. Pages Conference National Renewable Energy Laboratory (NREL), Golden, CO.

Kurtz, S., et al., *Using MOVPE growth to generate tomorrow's solar electricity*; J. Cryst. Growth; vol. 298; Jan. 2007, pp. 748-753.

Lee, H. S., et al.; *Field test and analysis: the behavior of 3-J concentrator cells under the control of cell temperature*; Conference Record of the Thirty-First IEEE Photovoltaic Specialist Conference; 2005 pp. 754-757.

Li, N.Y. et al., *Development of 1.25 eV InGaAsN for Triple Junction Solar Cells*, 28th IEEE PVSC, 2000, p. 986.

Loeckenhoff, R. et al.; *1000 sun, compact receiver based on monolithic interconnected modules (MIMS)*; Conference Record of the 2006 IEEE 4th World Conference on Photovoltaic Energy Conversion (IEEE Cat. No. 06CH37747) 2006 ; pp. 4.

Lynch, M. C., et al.; *Spectral response and I-V characteristics of large well number multi quantum well solar cells* Journal of Materials Science ; vol. 40 ; No. 6 , Mar. 2005 , pp. 1445.

Madrid, J., et al., *Investigation of the efficiency boost due to spectral concentration in a quantum-dot based luminescent concentrator*; Conference Record of the 2006 IEEE 4th World Conference on Photovoltaic Energy Conversion; 2006; pp. 4.

McConnell, r., et al.; *Multijunction photovoltaic technologies for high-performance concentrators*; Conference Record of the 2006 IEEE 4th World Conference on Photovoltaic Energy Conversion; 2005; pp. 4.

McMahon, W.E., et al.; *Outdoor Testing of GaInP2/GaAs Tandem Cells with Top Cell Thickness Varied*; National Renewable Energy Laboratory (NREL), Golden, Co. Conference Aug. 1, 2005.

Meusel, Ml et al.; *Characterization of monolithic III-V multi-junction solar cells—challenges and application*; Sol. Energy Mater. Sol. Cells; Nov. 23, 2006; vol. 90, No. pp. 3268-3275.

Nishioka, K., et al., *Annual output estimation of concentrator photovoltaic systems using high-efficiency InGaP/InGaAs/Ge triple-junction solar cells based on experimental solar cell's characteristics and field-test meteorological data*; Sol. Energy Mater. Sol. Cells; vol. 90; No. 1; Jan. 6, 2006, pp. 57-67.

Nishioka, K., et al., *Evaluation of InGaP/InGaAs/Ge triple junction solar cell and optimization of solar cell's structure focusing on series resistance for high-efficiency concentrator photovoltaic systems*; Sol. Energy Mater. Sol. Cells; vol. 90; No. 9; May 23, 2006, pp. 1308-1321.

Nishioka, K., et al., Evaluation of temperature characteristics of high-efficiency InGaP/InGaAs/Ge triple junction solar cells under concentration; Sol. Energy Mater. Sol. Cells; vol. 85; 2005, pp. 429-436.

Ortabasi, U., et al., *Dish/Photovoltaics Cavity Converter (PVCC) System for Ultimate Solar-to-Electricity Conversion Efficiency General Concept and First Performance Predictions*, 29th IEEE PVSC, 2002, p. 1616.

Qui, K., et al.; *Thermophotovoltaic power generation systems using natural gas-fired radiant burners*; Sol Energy Mater. Sol. Cells; vol. 91; No. 7; Apr. 16, 2007.

Rey-Stolle, Ignacio et al. *Assessment of a low-cost gold-free metallization for III-V high concentrator solar cells*; Solar Energy Materials and Solar Cells; Journal vol. 91; Journal Issue: 9 ; May 23, 2007 ; pp. 847-850.

Rumyantsev, V.E., et al.; *Terrestrial concentrator PV modules based on GaInP/GaAs/Ge TJ cells and minilens panels*; Conference Record of the 2006 IEEE 4th World Conference on Photovoltaic Energy Conversion; 2006; pp. 4.

Sharps, P.R., et al., AlGaAs/InGaAlP Tunnel Junctions for Multijunction Solar Cells, 28th IEEE PVSC, 2000, p. 1185.

Sharps, P.R., et al., *Electron and Proton Radiation Study of GaInP2/GaAs/Ge Solar Cell*, 17th European Solar Energy Conference, 2001, p. 2163-2166.

Sharps, P.R. et al, *Ultra high-efficiency advanced triple junction (ATJ) solar cell production at Emcore photovoltaics*, Energy Conversion Engineering Conference, 2002. 37th Intersociety Jul. 29-31, 2002 pp. 333-eoa. (Abstract).

Sharps, P.R., et al. *Modeling and Testing of Multi-junction Solar Cell Reliability*; Presented at the 2003 Space Power Workshop 2003, Emcore Corporation, Torrance, CA.

Sharps, P.R., et al., *Proton and Electron Radiation Analysis of GaInP2/GaAs Solar Cells*, 28th IEEE PVSC, 2000, p. 1098.

Sherif, R. A., et al.; *First demonstration of multi junction receivers in a grid-connected concentrator module*; Conference Record of the Thirty-First IEEE Photovoltaic Specialist Conference; 2005; pp. 635-638.

Shvarts, M. Z et al. *Space Fresnel lens concentrator modules with triple-junction solar cells*; Conference Record of the Thirty-First IEEE Photovoltaic Specialist Conference; 2005; pp. 818-821.

Shvartz, M.Z., et al., *Indoor Characterization of the Multifunction III-V Solar Cells and Concentrator Modules*; European Photovoltaic Solar Energy Conference; 2005; pp. 1AV.2.3.

Siefer, G., et al., *Calibration of III-V concentrator cells and modules*; Conference Record of the 2006 IEEE 4th World Conference on Photovoltaic Energy Conversion; 2006; pp. 4.

Slade, A., et al., *High Efficiency Solar Cells for Concentrator Systems: Silicon or Multi-Junction?*, SPIE Optics and Photonics, San Diego, CA, Aug. 2005 ( 8 pages).

Stan, M. A., et al; *InGaP/InGaAs/Ge high concentration solar cell development at Emcore* Photovoltaic Specialists Conference, 2005. Conference Record of the Thirty-first IEEE Jan. 3-7, 2005 pp. 770-773.

Stan, M.A., et al. , *27.5% Efficiency InGaP/InGaAs/Ge Advanced Triple Junction (ATJ) Space Solar Cells for High Volume Manufacturing*, 29th IEEE PVSC, 2002, p. 816-819.

Stone, K.W. et al., *Design & Performance of the Amonix High Concentration Solar PV System*; ASES/ASME National Solar Energy Conference. Reno, NV, 2002 ( 8 pages).

Stone, K.W. et al., *Operation of 350 kW of Amonix High Concentration PV Systems at Arizona Public Service*; Proc. ISEC 2003, Hawaii, Mar. 15-18, 2003 p. 1-6.

Takamoto, T., et al., *Concentrator compound solar cells*; Shap Tech. J.; No. 93, Dec. 2005; pp. 49-53.

Takamoto, T., et al., *Future development of InGaP/(In)GaAs based multijunction solar cells*; Conference Record of the Thirty-First IEEE Photovoltaic Specialist Conference; 2005; pp. 519-524.

Tomita, T. et al. ; *Blazing a new path to the future*; Conference Record of the 2006 IEEE 4th World Conference on Photovoltaic Energy Conversion (IEEE Cat. No. 06CH37747 ; 2006 PP 4 pp.

van Reisen, S., et al.; *Degradation study of III-V solar cells for concentrator applications*; Prog. Photovolt., Res. Appl. vol. 13, No. 5; Aug. 2005; pp. 369-380.

Van Sark, W.G.J.H.M., et al., *FULLSPECTRUM: a new PV wave making more efficient use of the solar spectrum*; Sol. Energy Mater. Sol. Cells; Vol. 87; No. 1-4; May 2005; pp. 467-479.

Verlinden, P.J., et al.; *Performance and reliability of multijunction III-V modules for concentrator dish and central receiver applications*; Conference Record of the 2006 IEEE 4th World Conference on Photovoltaic Energy Conversion; 2006; pp. 6.

Vlasov, A. S., et al.; *TPV systems with solar powered tungsten emitters*; AIP Conf. Proc.vol. 890 No. 1 2007 pp. 327-334.

Wanlass, M. W., et al. *GaInP/GaAs/GaInAs Monolithic Tandem Cells for High-Performance Solar Concentrators*; Aug. 1, 2005; National Renewable Energy Laboratory (NREL), Golden, CO.

Yamaguchi, M., et al., *Super high-efficiency multi-junction and concentrator solar cells*; Sol. Energy Mater. Sol. Cells; vol. 90; No. 18-19; Nov. 23, 2006 pp. 3068-3077.

Yamaguchi, M., et al., *Super-high-efficiency multifunction solar cells*; Prog. Photovolt., Res. Appl. vol. 13 No. 2; Mar. 2005, pp. 125-132.

Yamaguchi, M., et al.; *Multi-junction III-V solar cells: current status and future potential*; Sol. Energy, vol. 9, No. 1; Jul. 2005; pp. 78-85.

Yen-Chang Tzeng, et al., *The development of an 1kW HCPV system at INER*; Conference Record of the 2006 IEEE 4th World Conference on Photovoltaic Energy Conversion; 2006; pp. 3.

Untitled, available at www.osa-opn.org, pp. 28-31, OPN Oct. 2007.

Sol Focus, Inc. , Web printouts available at www.solfocus.com, (last visited Nov. 1, 2007).

Concentrix Solar, Web printouts available at www.concentrixolar.de/cms/english-flatcontechnology.html (last visited Nov. 1, 2007).

Isofoton, Web printouts available at www.isofoton.com (last visited Nov. 1, 2007).

Emcore Corporation, *Office Action Summary for Applications Under Accelerated Examination*, Oct. 15, 2007.

Luque, A, et al. *Concentrators: The Path To Commercialization of the Novel Sophisticated Ultra High Efficiency Solar Cells*, 4th International Conference on Solar Concentrators for the Generation of Electricity or Hydrogen, Mar. 12-16, 2007, San Lorenzo de El Escorial, SPAIN.

Kurtz, S. et al, *A Comparison of Theoretical and Experimental Efficiencies of Concentrator Solar Cells*, 4th International Conference on Solar Concentrators for the Generation of Electricity or Hydrogen, Mar. 12-16, 2007, San Lorenzo de El Escorial, SPAIN.

Luque-Herdia, I., et al. *CPV Tracking Systems: Performance Issues, Specification and Design*, 4th International Conference on Solar Concentrators for the Generation of Electricity or Hydrogen, Mar. 12-16, 2007, San Lorenzo de El Escorial, SPAIN.

Winston, Roland, *Concentrators Optics for Photovoltaics*, 4th International Conference on Solar Concentrators for the Generation of Electricity or Hydrogen, Mar. 12-16, 2007, San Lorenzo de El Escorial, SPAIN.

Bett, Andreas, et al, *The Needs for Industrialization of CPV Technologies*, 4th International Conference on Solar Concentrators for the Generation of Electricity or Hydrogen, Mar. 12-16, 2007, San Lorenzo de El Escorial, SPAIN.

Hines, Brad, *Trends in the Economics of Solar Concentrators*, 4th International Conference on Solar Concentrators for the Generation of Electricity or Hydrogen, Mar. 12-16, 2007, San Lorenzo de El Escorial, SPAIN.

King, R. et al., *Metamorphic Concentrator Solar Cells with Over 40% Conversion Efficiency*, 4th International Conference on Solar Concentrators for the Generation of Electricity or Hydrogen, Mar. 12-16, 2007, San Lorenzo de El Escorial, SPAIN.

Gonzalez, J.R., *III-V High Concentrator Solar Cells: Assessing the Reliability of a New Product*, 4th International Conference on Solar Concentrators for the Generation of Electricity or Hydrogen, Mar. 12-16, 2007, San Lorenzo de El Escorial, SPAIN.

Newman, F.D. et al., *Terrestrial Solar Cell DEVELOPMENT at Emcore and Roadmap to Achieving Higher Performance*, 4th International Conference on Solar Concentrators for the Generation of Electricity or Hydrogen, Mar. 12-16, 2007, San Lorenzo de El Escorial, SPAIN.

Heasman, K.C., et al., *Development of laser grooved buried contact solar cells for use at concentration factors up to 100X*, 4th International Conference on Solar Concentrators for the Generation of Electricity or Hydrogen, Mar. 12-16, 2007, San Lorenzo de El Escorial, SPAIN.

Connolly, J.P., *Mirrored strain-balanced quantum well concentrator cells in the radiative limit*, 4th International Conference on Solar Concentrators for the Generation of Electricity or Hydrogen, Mar. 12-16, 2007, San Lorenzo de El Escorial, SPAIN.

Morilla, M.C., et al., *Technology Improvements in Buried Contact Cells Optimised for Concentration Systems*, 4th International Conference on Solar Concentrators for the Generation of Electricity or Hydrogen, Mar. 12-16, 2007, San Lorenzo de El Escorial, SPAIN.

Rumyantsev, V.D., et al., *Solar concentrator modules with fresnel lens panels*, 4th International Conference on Solar Concentrators for the Generation of Electricity or Hydrogen, Mar. 12-16, 2007, San Lorenzo de El Escorial, SPAIN.

Fraas, L., et al., *Possible Improvements in the Cassegrainian PV Module*, 4th International Conference on Solar Concentrators for the Generation of Electricity or Hydrogen, Mar. 12-16, 2007, San Lorenzo de El Escorial, SPAIN.

Johnson Jr., R.L., et al., *Hybrid Optic Design For Concentrator Panels*, 4th International Conference on Solar Concentrators for the Generation of Electricity or Hydrogen, Mar. 12-16, 2007, San Lorenzo de El Escorial, SPAIN.

Leutz, R., *Nonimaging Flat Fresnel Lenses*, 4th International Conference on Solar Concentrators for the Generation of Electricity or Hydrogen, Mar. 12-16, 2007, San Lorenzo de El Escorial, SPAIN.

Grilikhes, V.A., *The new approach to design of Fresnel lens sunlight concentrator*, 4th International Conference on Solar Concentrators for the Generation of Electricity or Hydrogen, Mar. 12-16, 2007, San Lorenzo de El Escorial, SPAIN.

Cowley, S. et al. *Acceptance angle requirements for point focus CPV Systems*, 4th International Conference on Solar Concentrators for the Generation of Electricity or Hydrogen, Mar. 12-16, 2007, San Lorenzo de El Escorial, SPAIN.

Hayashi, Toshiaki et al., *Large Scale Commercialization and Marketing Opportunities for Cost Effective Concentrator PV*, 4th International Conference on Solar Concentrators for the Generation of Electricity or Hydrogen, Mar. 12-16, 2007, San Lorenzo de El Escorial, SPAIN.

Lasich, J.B., et al., *Opportunities for widespread implementation of concentrator photovoltaic (CPV) Systems*, 4th International Conference on Solar Concentrators for the Generation of Electricity or Hydrogen, Mar. 12-16, 2007, San Lorenzo de El Escorial, SPAIN.

Rubio, F., et al., *Establishment of the Institute of Concentration Photovoltaic Systems—ISFOC*, 4th International Conference on Solar Concentrators for the Generation of Electricity or Hydrogen, Mar. 12-16, 2007, San Lorenzo de El Escorial, SPAIN.

Araki, Kenji, *500X to 1000X—R&D and Market Strategy of Daido Steel*, 4th International Conference on Solar Concentrators for the Generation of Electricity or Hydrogen, Mar. 12-16, 2007, San Lorenzo de El Escorial, SPAIN.

Slade, Alexander, et al., *A Comparison of Concentrator Cell Technologies*, 4th International Conference on Solar Concentrators for the Generation of Electricity or Hydrogen, Mar. 12-16, 2007, San Lorenzo de El Escorial, SPAIN.

Castro, M., et al., *Guascor Fotón: Contribution of the Manufacturing of Concentrator PV Systems*, 4th International Conference on Solar Concentrators for the Generation of Electricity or Hydrogen, Mar. 12-16, 2007, San Lorenzo de El Escorial, SPAIN.

Aiken, Daniel, et al., *Delivering Known Good Die: High Volume testing of Multijunction Solar Cells for use in Terrestrial Concentrator Systems*, 4th International Conference on Solar Concentrators for the Generation of Electricity or Hydrogen, Mar. 12-16, 2007, San Lorenzo de El Escorial, SPAIN.

Diaz, V., et al., *PV Systems Based on Very High Concentration: Isofotón Approach for Reaching the Market*, 4th International Conference on Solar Concentrators for the Generation of Electricity or Hydrogen, Mar. 12-16, 2007, San Lorenzo de El Escorial, SPAIN.

Roca, F., et al., *Development and Performance Analysis of the Phocus C-Module*, 4th International Conference on Solar Concentrators for the Generation of Electricity or Hydrogen, Mar. 12-16, 2007, San Lorenzo de El Escorial, SPAIN.

Rasello, Franco, et al., *Comparison between Different Solar Concentrators as regards to the Electric Generation*, 4th International Conference on Solar Concentrators for the Generation of Electricity or Hydrogen, Mar. 12-16, 2007, San Lorenzo de El Escorial, SPAIN.

Vossier, A., et al., *Experimental Test and Modelling of Concentrator Solar Cells Under Medium and High Fluxes*, 4th International Conference on Solar Concentrators for the Generation of Electricity or Hydrogen, Mar. 12-16, 2007, San Lorenzo de El Escorial, SPAIN.

Korech, Omer, et al., *High-Flux Characterization of Ultra-Small Triple-Junction Concentrator Solar Cells*, 4th International Conference on Solar Concentrators for the Generation of Electricity or Hydrogen, Mar. 12-16, 2007, San Lorenzo de El Escorial, SPAIN.

4th International Conference on Solar Concentrators for the Generation of Electricity or Hydrogen, Mar. 12-16, 2007, San Lorenzo de El Escorial, SPAIN.

Parretta, A., et al., *Fluxmeter for Parabolic Trough Solar Concentrators*, 4th International Conference on Solar Concentrators for the Generation of Electricity or Hydrogen, Mar. 12-16, 2007, San Lorenzo de El Escorial, SPAIN.

Chellini, S., et al., *Inverters response time with concentration PV systems*, 4th International Conference on Solar Concentrators for the Generation of Electricity or Hydrogen, Mar. 12-16, 2007, San Lorenzo de El Escorial, SPAIN.

Martinez, M., et al., *Prediction of the Energy Production of a PV concentrators: Case of wind influence*, 4th International Conference on Solar Concentrators for the Generation of Electricity or Hydrogen, Mar. 12-16, 2007, San Lorenzo de El Escorial, SPAIN.

Parretta, A. et al., *Fluxmeter For Point Focus Solar Concentrators*, 4th International Conference on Solar Concentrators for the Generation of Electricity or Hydrogen, Mar. 12-16, 2007, San Lorenzo de El Escorial, SPAIN.

Bohner, Jon., et al., *Autonomous Energy Polygeneration Solar Concentrator*, 4th International Conference on Solar Concentrators for the Generation of Electricity or Hydrogen, Mar. 12-16, 2007, San Lorenzo de El Escorial, SPAIN.

Kribus, A., et al., *Practical cogeneration with concentrating PV*, International Conference on Solar Concentrators for the Generation of Electricity or Hydrogen, Mar. 12-16, 2007, San Lorenzo de El Escorial, SPAIN.

Dallakyan, V., et al., *Mirror Reflecting Cost Effective Pv Solar Energy Concentrating System*, International Conference on Solar Concentrators for the Generation of Electricity or Hydrogen, Mar. 12-16, 2007, San Lorenzo de El Escorial, SPAIN.

Rubin, L., et al., *DAY4TM PV Receivers and Heat Sinks For Sun Concentration Applications*, 4th International Conference on Solar Concentrators for the Generation of Electricity or Hydrogen, Mar. 12-16, 2007, San Lorenzo de El Escorial, SPAIN.

Wu, Yupeng, et al., *Optical Analysis of Asymmetric Compound Parabolic Photovoltaic Concentrators (ACPPVC) Suitable for building Facade Integration*, 4th International Conference on Solar Concentrators for the Generation of Electricity or Hydrogen, Mar. 12-16, 2007, San Lorenzo de El Escorial, SPAIN.

Tripanagnostopoulos, Y., *Linear Fresnel Lenses With Photovoltaics for Cost Effective Electricity Generation and Solar Control of Buildings*, 4th International Conference on Solar Concentrators for the Generation of Electricity or Hydrogen, Mar. 12-16, 2007, San Lorenzo de El Escorial, SPAIN.

Chemisana, D., et al., *Effect of a secondary LINEAR concentrator on the Si solar cell electrical parameters*, 4th International Conference on Solar Concentrators for the Generation of Electricity or Hydrogen, Mar. 12-16, 2007, San Lorenzo de El Escorial, SPAIN.

Leutz, R., et al., *Segmented Cone Concentrators: Optical Design*, 4th International Conference on Solar Concentrators for the Generation of Electricity or Hydrogen, Mar. 12-16, 2007, San Lorenzo de El Escorial, SPAIN.

Karvelas, E., at al., *Mirrors based on total reflection for concentration PV panels*, 4th International Conference on Solar Concentrators for the Generation of Electricity or Hydrogen, Mar. 12-16, 2007, San Lorenzo de El Escorial, SPAIN.

Stefrancich, Marco, et al., *Optical tailoring of flat faceted collector for optimal flux distribution on CPV receiver*, 4th International Conference on Solar Concentrators for the Generation of Electricity or Hydrogen, Mar. 12-16, 2007, San Lorenzo de El Escorial, SPAIN.

Abdel Mesih, B., et al., *Loss of optical quality of a photovoltaic thermal concentrator device at different tracking position*, 4th International Conference on Solar Concentrators for the Generation of Electricity or Hydrogen, Mar. 12-16, 2007, San Lorenzo de El Escorial, SPAIN.

Harwood, D., et al., *Receiver development for rooftop concentrator applications*, 4th International Conference on Solar Concentrators for the Generation of Electricity or Hydrogen, Mar. 12-16, 2007, San Lorenzo de El Escorial, SPAIN.

Katz, E.A., et al., *Mapping Concentrator Solar Cell Properties by Localized Irradiation at Ultrahigh Flux*, 4th International Conference on Solar Concentrators for the Generation of Electricity or Hydrogen, Mar. 12-16, 2007, San Lorenzo de El Escorial, SPAIN.

Tzeng, Yen-Chang, et al., *Status of concentration type III-V solar cell development at INER Taiwan*, 4th International Conference on Solar Concentrators for the Generation of Electricity or Hydrogen, Mar. 12-16, 2007, San Lorenzo de El Escorial, SPAIN.

Cole, A., et al, *Front Contact Modelling of Monocrystaline Silicon Laser Grooved Buried Contact Solar Cells*, 4th International Conference on Solar Concentrators for the Generation of Electricity or Hydrogen, Mar. 12-16, 2007, San Lorenzo de El Escorial, SPAIN.

Diaz, V., et al., *ISOSIM: A Multijunction Solar Cell Simulation Program*, 4th International Conference on Solar Concentrators for the Generation of Electricity or Hydrogen, Mar. 12-16, 2007, San Lorenzo de El Escorial, SPAIN.

Kotsovos, K., et al., *Crystalline silicon solar cell design optimized for concentrator applications*, 4th International Conference on Solar Concentrators for the Generation of Electricity or Hydrogen, Mar. 12-16, 2007, San Lorenzo de El Escorial, SPAIN.

Perez, P.J., et al., *Multi-Trackers Systems. Calculation of losses due to self shadowing*, 4th International Conference on Solar Concentrators for the Generation of Electricity or Hydrogen, Mar. 12-16, 2007, San Lorenzo de El Escorial, SPAIN.

Yeh, H., et al., *Hybrid Mode Tracking control mechanism used in HCPV tracker*, 4th International Conference on Solar Concentrators for the Generation of Electricity or Hydrogen, Mar. 12-16, 2007, San Lorenzo de El Escorial, SPAIN.

Mallick, Tapas K., et al., *Optical Performance Predictions for a High Concentration Point Focus Photovoltaic System*, 4th International Conference on Solar Concentrators for the Generation of Electricity or Hydrogen, Mar. 12-16, 2007, San Lorenzo de El Escorial, SPAIN.

Vivar, M., et al., *Third Generation of EUCLIDES System: First results and modelling of annual production in Ideoconte Project Test sites*, 4th International Conference on Solar Concentrators for the Generation of Electricity or Hydrogen, Mar. 12-16, 2007, San Lorenzo de El Escorial, SPAIN.

Gordon, Robert, et al., *Towards a 33% Efficient Photovoltaic Module*, 4th International Conference on Solar Concentrators for the Generation of Electricity or Hydrogen, Mar. 12-16, 2007, San Lorenzo de El Escorial, SPAIN.

Lerchenmuller, H., et al., *From FLATCON Pilot Systems to the first Power Plant*, 4th International Conference on Solar Concentrators for the Generation of Electricity or Hydrogen, Mar. 12-16, 2007, San Lorenzo de El Escorial, SPAIN.

Kusek, Stephen et al., *Description and Performance of the MicroDish Concentrating Photovoltaic System*, 4th International Conference on Solar Concentrators for the Generation of Electricity or Hydrogen, Mar. 12-16, 2007, San Lorenzo de El Escorial, SPAIN.

Sarno, Angelo et al., *Enea Experience on the PV-Concentrators Technology: The phocus Project*, 4th International Conference on Solar Concentrators for the Generation of Electricity or Hydrogen, Mar. 12-16, 2007, San Lorenzo de El Escorial, SPAIN.

Anstey, B., et al., *Progress with the Whitfield Solar PV Concentrator*, 4th International Conference on Solar Concentrators for the Generation of Electricity or Hydrogen, Mar. 12-16, 2007, San Lorenzo de El Escorial, SPAIN.

Symko-Davies, M., et al., *Research Initiatives on High-Efficiency Low-Cost Concentrator Photovoltaics*, 4th International Conference on Solar Concentrators for the Generation of Electricity or Hydrogen, Mar. 12-16, 2007, San Lorenzo de El Escorial, SPAIN.

Benitez, Pablo, et al., *XR: A High-Performance Photovoltaic Concentrator*, 4th International Conference on Solar Concentrators for the Generation of Electricity or Hydrogen, Mar. 12-16, 2007, San Lorenzo de El Escorial, SPAIN.

Pereles, Oscar, et al., *High Concentration PV System*, 4th International Conference on Solar Concentrators for the Generation of Electricity or Hydrogen, Mar. 12-16, 2007, San Lorenzo de El Escorial, SPAIN.

O'Neill, Mark, *Advances in Color-Mixing Lens/Multijunction Cell (CLM/MJC) Concentrators for Space and Ground Power*, 4th International Conference on Solar Concentrators for the Generation of Electricity or Hydrogen, Mar. 12-16, 2007, San Lorenzo de El Escorial, SPAIN.

Eames, Philip C., et al., *The Prediction of the Thermal Behaviour of a Low Concentration Non-Imaging Asymmetric Dielectric Concentrator for Building Facade Applications*, 4th International Conference on Solar Concentrators for the Generation of Electricity or Hydrogen, Mar. 12-16, 2007, San Lorenzo de El Escorial, SPAIN.

Swinkels, G.L.A.M., et al., *Energy Conversion of Concentrated near Infrared Radiation in a Solar Greenhouse*, 4th International Conference on Solar Concentrators for the Generation of Electricity or Hydrogen, Mar. 12-16, 2007, San Lorenzo de El Escorial, SPAIN.

McConnell, R., et al., *Concentrator Photovoltaic Standards*, 4th International Conference on Solar Concentrators for the Generation of Electricity or Hydrogen, Mar. 12-16, 2007, San Lorenzo de El Escorial, SPAIN.

Rumyantsev, V.D., et al., *Indoor Characterization of Multijunction Concentrator Cells Under Flash Illumination with Variable Spectrum*, 4th International Conference on Solar Concentrators for the Generation of Electricity or Hydrogen, Mar. 12-16, 2007, San Lorenzo de El Escorial, SPAIN.

Dominguez, C., et al., *Characterization of a new solar simulator for concentrator PV modules*, 4th International Conference on Solar Concentrators for the Generation of Electricity or Hydrogen, Mar. 12-16, 2007, San Lorenzo de El Escorial, SPAIN.

Vallribera, J., et al., *Technical highlights of a solar simulator for high concentration PV modules*, 4th International Conference on Solar Concentrators for the Generation of Electricity or Hydrogen, Mar. 12-16, 2007, San Lorenzo de El Escorial, SPAIN.

Nitz, P., et al., *Indoor Characterisation of Fresnel Type Concentrator Lenses*, 4th International Conference on Solar Concentrators for the Generation of Electricity or Hydrogen, Mar. 12-16, 2007, San Lorenzo de El Escorial, SPAIN.

Faiman, David, et al., *On the survival qualities of an un-encapsulated GaAs Dense array CPV module from 1X-1,000X under outdoor tests in the Negev Desert*, 4th International Conference on Solar Concentrators for the Generation of Electricity or Hydrogen, Mar. 12-16, 2007, San Lorenzo de El Escorial, SPAIN.

Gordon, Robert, et al., *The Amonix 6th Generation HCPV System*, 4th International Conference on Solar Concentrators for the Generation of Electricity or Hydrogen, Mar. 12-16, 2007, San Lorenzo de El Escorial, SPAIN.

Cancro, C., et al., *Field Testing of the Phocus Solar Tracker by means of a Novel Optoelectronic Device*, 4th International Conference on Solar Concentrators for the Generation of Electricity or Hydrogen, Mar. 12-16, 2007, San Lorenzo de El Escorial, SPAIN.

Shin, Hwa-Yuh, et al., *The Development of a 5kW HCPV Systems at INER*, 4th International Conference on Solar Concentrators for the Generation of Electricity or Hydrogen, Mar. 12-16, 2007, San Lorenzo de El Escorial, SPAIN.

Fraas, L., et al., *Start-Up of First 100 kW System in Shanghai with 3-Sun PV Mirror Modules*, 4th International Conference on Solar Concentrators for the Generation of Electricity or Hydrogen, Mar. 12-16, 2007, San Lorenzo de El Escorial, SPAIN.

Klotz, Fritz H., et al., *Integrated Parabolic Trough (IPT) for Low Concentration PV Systems*, 4th International Conference on Solar Concentrators for the Generation of Electricity or Hydrogen, Mar. 12-16, 2007, San Lorenzo de El Escorial, SPAIN.

Notice of Allowance of U.S. Appl. No. 12/264,369, filed Nov. 4, 2008.

King et al "High-efficiency space and terrestrial multijunction solar cells through bandgap control in cell structures" May 19, 2002; Conference records of the 29th IEEE Photovoltaic Specialist conference; pp. 776-781.

Guter, W. et al. "Tunnel Diodes for III-V Multi-junction Solar Cells". Proc. 20th European Photovoltaic Solar Energy Conference. Barcelona, Jun. 6-10, 2005. p. 515-518.

Office Action received in U.S. Appl. No. 12/191,142, filed Aug. 13, 2008.

* cited by examiner

SOLAR CELL RECEIVER FOR CONCENTRATED PHOTOVOLTAIC SYSTEM FOR III-V SEMICONDUCTOR SOLAR CELL

CROSS-REFERENCE TO RELATED APPLICATIONS

The disclosure of this application is related to co-pending U.S. application Ser. No. 11/830,576, filed on Jul. 30, 2007; U.S. application Ser. No. 11/830,636, filed on Jul. 30, 2007 and U.S. application Ser. No. 11/849,033, filed on Aug. 31, 2007.

TECHNICAL FIELD

This disclosure relates to a solar cell receiver for a concentrated photovoltaic system design for a III-V compound semiconductor multijunction solar cell.

BACKGROUND

Satisfying the world's growing demand for energy is one of the most significant challenges facing society. At present, about 85% of the energy produced in the United States comes from fossil fuels. Given that the supply of such fuels is on the decline, their prices continue to rise, and the resultant greenhouse gases may contribute to global warming, there is a need to develop new technologies that are economically feasible and environmentally friendly.

Solar energy is one technology for power generation that is clean, quiet and renewable. It is also plentiful: with an average of roughly 125,000 terawatts of solar energy reaching the planet at any given time, solar technology can potentially generate a significant amount of energy.

Solar cells are used to convert solar or radiant energy into electricity. Typically, a plurality of solar cells are disposed in an array or panel, and a solar energy system typically includes a plurality of such panels. The solar cells in each panel are usually connected in series, and the panels in a given system are also connected in series, with each panel having numerous solar cells. The solar cells in each panel could, alternatively, be arranged in parallel.

Historically, solar power (both in space and terrestrially) has been predominantly provided by silicon solar cells. In the past several years, however, high-volume manufacturing of high-efficiency III-V multijunction solar cells has enabled the consideration of this alternative technology for terrestrial power generation. Compared to Si, III-V multijunction cells are generally more radiation resistant and have greater energy conversion efficiencies, but they tend to cost more. Some current III-V multijunction cells have energy efficiencies that exceed 27%, whereas silicon technologies generally reach only about 17% efficiency. Under concentration, some current III-V multijunction cells have energy efficiencies that exceed 37%. When the need for very high power or smaller solar arrays are paramount in a spacecraft or other solar energy system, multijunction cells are often used instead of, or in hybrid combinations with, Si-based cells to reduce the array size.

Generally speaking, the multijunction cells are of n-on-p polarity and are composed of InGaP/(In)GaAs/Ge compounds. III-V compound semiconductor multijunction solar cell layers can be grown via metal-organic chemical vapor deposition (MOCVD) on Ge substrates. The use of the Ge substrate permits a junction to be formed between n- and p-Ge. The solar cell structures can be grown on 100-mm diameter (4 inch) Ge substrates with an average mass density of about 86 mg/cm$^2$. In some processes, the epitaxial layer uniformity across a platter that holds 12 or 13 Ge substrates during the MOCVD growth process is better than 99.5%. Each wafer typically yields two large-area solar cells. The cell areas that are processed for production typically range from 26.6 to 32.4 cm$^2$. The epi-wafers can be processed into complete devices through automated robotic photolithography, metallization, chemical cleaning and etching, antireflection (AR) coating, dicing, and testing processes. The n- & p-contact metallization is typically comprised of predominately Ag with a thin Au cap layer to protect the Ag from oxidation. The AR coating is a dual-layer TiO$_x$/Al$_2$O$_3$ dielectric stack, whose spectral reflectivity characteristics are designed to minimize reflection at the coverglass-interconnect-cell (CIC) or solar cell assembly (SCA) level, as well as, maximizing the end-of-life (EOL) performance of the cells.

In some multijunction cells, the middle cell is an InGaAs cell as opposed to a GaAs cell. The indium concentration may be in the range of about 1.5% for the InGaAs middle cell. In some implementations, such an arrangement exhibits increased efficiency. The InGaAs layers are substantially perfectly lattice-matched to the Ge substrate.

Regardless of the type of cell used, a known problem with solar energy systems is that individual solar cells can become damaged or shadowed by an obstruction. For example, damage can occur as a result of exposure of a solar cell to harsh environmental conditions. The current-carrying capacity of a panel having one or more damaged or shadowed solar cells is reduced, and the output from other panels in series with that panel reverse biases the damaged or shadowed cells. The voltage across the damaged or shadowed cells thus increases in a reverse polarity until the full output voltage of all of the panels in the series is applied to the damaged or shadowed cells in the panel concerned. This causes the damaged or shadowed cells to breakdown.

As a solar cell system for terrestrial applications has thousands of solar cells, its voltage output is normally in the range of hundreds of volts, and its current output is in the range of tens of amperes. At these output power levels, if the solar cell terminals are not protected, uncontrollable electric discharge in the form of sparks tends to occur, and this can cause damage to the solar cells and to the entire system.

Another disadvantage of known solar cell receivers is that, owing to the need for such a receiver to generate 10 watts of power at 1000 volts for an extended period of up to, or exceeding, twenty years, there is a danger of sparking at various points on the receiver or at the electrical terminals which connect one receiver of a solar cell system to adjacent receivers.

SUMMARY

In an aspect of the invention, a solar cell module comprises a solar cell receiver having a multijunction III-V compound semiconductor solar cell, a secondary optical element and a lens to concentrate incident light onto the solar cell.

The details of one or more implementations are set forth in the accompanying drawings and the description below. Other features and advantages will be apparent from the description and drawings, and from the claims.

DETAILED DESCRIPTION

The following is a description of preferred implementations, as well as some alternative implementations, of a solar cell receiver having an insulated bypass diode.

I. Overview

Solar cell receivers convert solar energy into electricity. To accomplish this result, solar cell receivers generally comprise one or more solar cells. A solar cell may be made from, e.g., silicon (including amorphous, nanocrystalline, or protocrystalline), cadmium telluride, CIGS (copper indium gallium diselenide), CIS (chalcopyrite films of copper indium selenide ($CuInSe_2$)), gallium arsenide (e.g., GaAs multijunctions), light absorbing dyes (e.g., ruthenium metalorganic dye), or organic semiconductors (e.g., polyphenylene vinylene, copper phthalocyanine or carbon fullerenes). In various implementations described herein, a triple-junction III-V compound semiconductor solar cell is employed, but other types of solar cells could be used depending upon the application. Solar cell receivers often contain additional components, e.g., connectors for coupling to an output device or other solar cell receivers.

For some applications, a solar cell receiver may be implemented as part of a solar cell module. A solar cell module may include a solar cell receiver and a lens coupled to the solar cell. The lens is used to focus received light onto the solar cell. As a result of the lens, a greater concentration of solar energy can be received by the solar cell. In some implementations, the lens is adapted to concentrate solar energy by a factor of 400 or more. For example, under 500-Sun concentration, 1 $cm^2$ of solar cell area produces the same amount of electrical power as 500 $cm^2$ of solar cell area would, without concentration. The use of concentration, therefore, allows substitution of cost-effective materials such as lenses and mirrors for the more costly semiconductor cell material. In some implementations, a single solar cell receiver under 400-Sun or more concentration can generate in excess of 14 watts of peak power.

Since a single solar cell module may not produce sufficient electricity for a given application, two or more solar cell modules may be grouped together into an array. These arrays are sometimes referred to as "panels" or "solar panels."

II. Implementations of a Solar Panel

Figure 1:
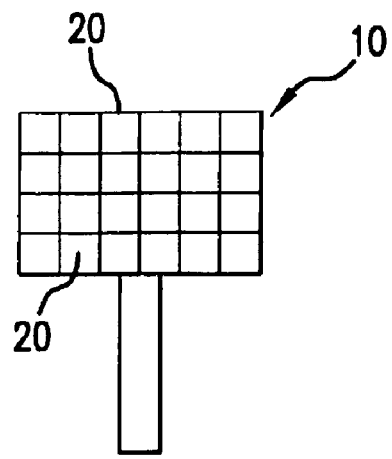
FIG. 1 is a perspective view of an implementation of a solar panel including apparatus for generating electricity from solar energy.

FIG. 1 depicts one implementation of a solar panel 10 for generating electricity from solar energy. The panel 10 includes a plurality of solar cell modules 20. In this illustration, twenty-four solar cell modules 20 are shown. Each module 20 can comprise one or more solar cell receivers (e.g., item 12a of FIG. 2A) and a corresponding lens (e.g., item 204a of FIG. 2A) to concentrate sunlight onto the solar cell of the solar cell receiver. A plurality of similar panels 10 can be combined to provide a solar energy generating system of greater capacity. Where a plurality of panels 10 is provided, they are normally connected in series, but other implementations may connect the panels in parallel or series-parallel.

III. Implementations of a Solar Cell Module

Figure 2A:
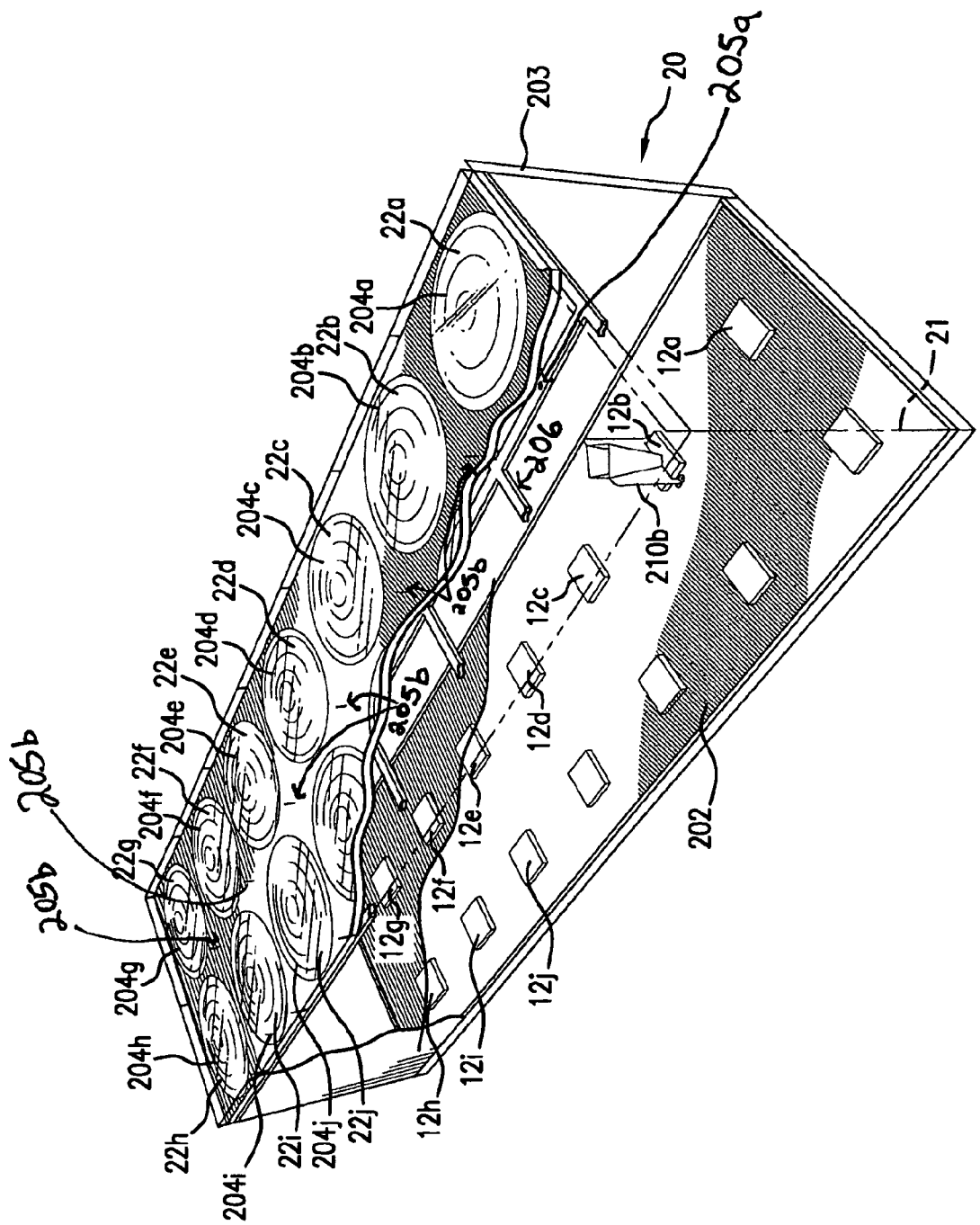
FIG. 2A is a perspective view of an implementation of a solar cell module.
Figure 4:
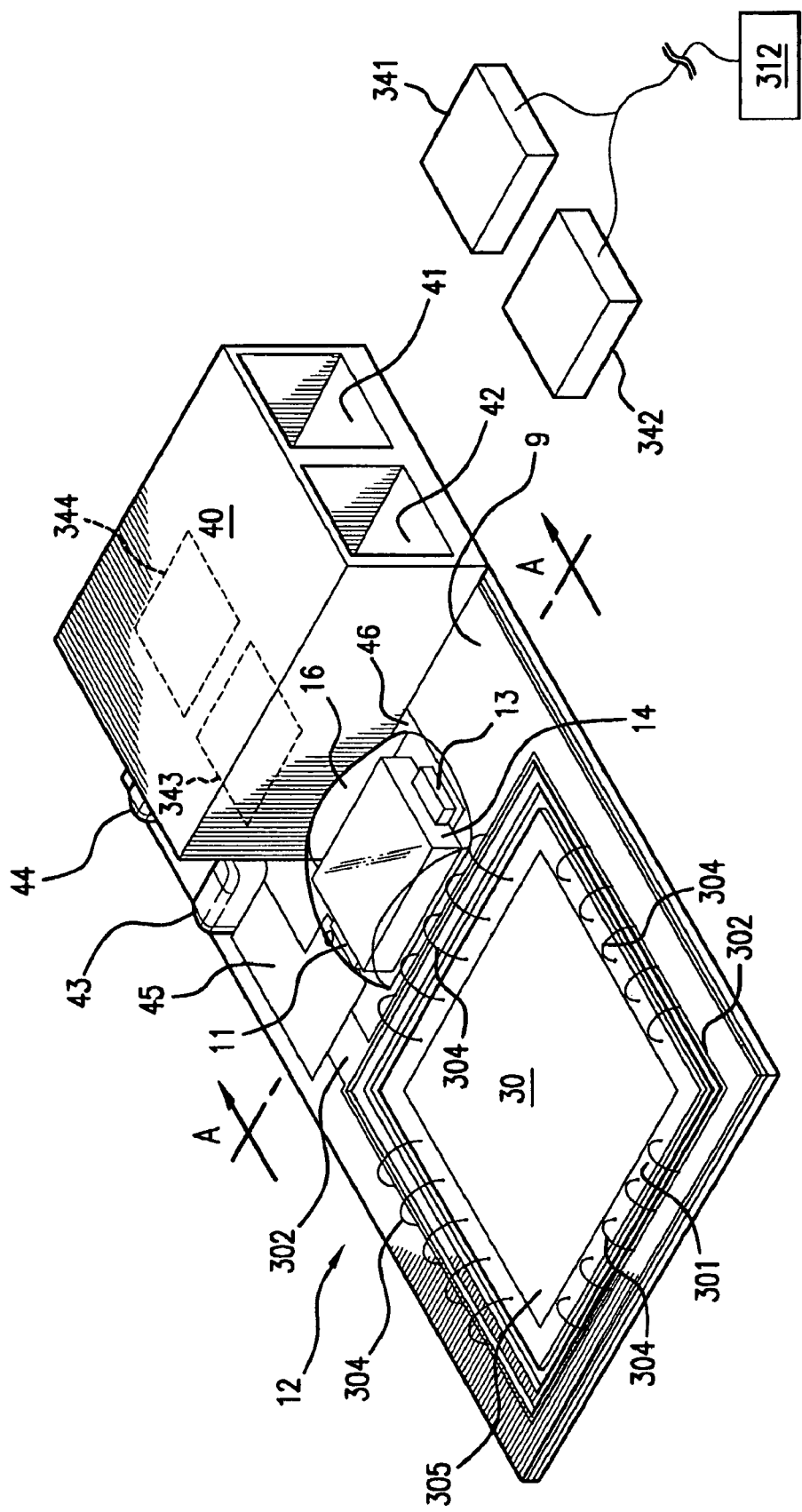
FIG. 4 is a perspective view of an implementation of a solar cell receiver, which forms part of the solar cell module of FIG. 2A.

FIG. 2A illustrates an implementation of a solar cell module 20 comprising an array of lenses 22a-22j (four of which are not shown to provide visibility into the housing 21 of the module 20) and corresponding solar cell receivers 12a-12j (each taking the form of item 12 of FIG. 4). In some implementations, a solar cell module comprises fourteen lenses and fourteen corresponding solar cell receivers. In the illustrated implementation, the array is a "7×2."

The lenses 22a-22j are formed on a continuous sheet 201 of optical material (e.g., acrylic). In some implementations, regions of the sheet 201 not formed into lenses 22a-22j are made partially or entirely opaque. By forming lenses 22a-22j out of a continuous sheet 201, costs can be decreased substantially. First, by producing the lenses on large sheets, production costs are decreased. Second, assembly costs are decreased because only one item (i.e., the sheet 201 of lenses) needs to be aligned with the solar cell receivers. In this implementation, sheet 201 is supported on its peripheral edges by the housing 21 and lies atop an alignment frame 206 with a plurality of frame alignment elements (e.g., holes) 205a. The holes 205a may be threaded or otherwise adapted to receive a fastener. The sheet 201 comprises sheet alignment elements 205b (e.g., pins, screws or other hardware) that align and couple with the frame alignment elements 205a. The frame alignment elements 205a and the sheet alignment elements 205b are located such that by coupling the sheet alignment elements 205b with the frame alignment elements 205a, each solar cell receiver 12a-12j is aligned with its respective lens 22a-22j. In some implementations, the surface 202 comprises alignment features that ensure that each solar cell receiver 12a-12j is located in a predetermined position. These features may couple with the substrate (e.g., item 9) of the solar cell receiver.

The alignment elements 205b (e.g., a pin) are located generally in a center point defined by four lenses. For example, an alignment element 205b is located in a center point defined by lenses 22f, 22g, 22h and 22i. Another alignment element 205 is located in a center point defined by lenses 22e, 22f, 22i and 22j. This pattern of locating the alignment element 205b in a center point defined by four lenses can continue along the entire sheet 201.

In some implementations, each lens 22a-22j is a Fresnel lens. The corresponding solar cell receiver 12a-12j is positioned at an opposite end of a housing 21, on surface 202. Each solar cell receiver 12a-12j includes a corresponding solar cell 30 (see FIG. 4) disposed in the optical path of the corresponding lens 22a-22j, i.e., such that the corresponding solar cell 30 receives light that passes through the corresponding lens 22a-22j. In some implementations, additional lenses and/or mirrors are employed to place the solar cell in the optical path of the lens. For example, a secondary optical element 210b is shown that corresponds with solar cell receiver 12b and lens 22b. The secondary optical element 210b gathers the light from lens 22b and focuses it into the solar cell of the solar cell receiver 12b. In some implementations, each solar cell receiver 12a-12j is provided with a corresponding secondary optical element. Secondary optical elements are discussed in more detail in connection with FIG. 2B.

While some Fresnel lenses can concentrate more sunlight than some convex lenses, implementations may use any type of lens 22a-22j that concentrates the incident sunlight. For example, any of lenses 22a-22j may take the form of a biconvex lens, a plano-convex lens, or a convex-concave lens. The lenses 22a-22j may also comprise a multi-layer anti-reflective coating 204a-204j (e.g., similar to the one applied to the solar cell 30).

The distance 203 between the sheet 201 comprising lenses 22a-22j and the corresponding solar cells of solar cell receivers 12a-12j can be chosen, e.g., based on the focal length of the lenses 22a-22j. In some implementations the module housing 21 is arranged so that the solar cell of each respective solar cell receiver 12a-12j is disposed at or about the focal point of the respective lens 22a-22j. In some implementations, the focal length of each lens 22a-22j is between about 25.4 cm (10 inches) and 76.2 cm (30 inches). In some implementations, the focal length of each lens 22a-22j is between about 38.1 cm (15 inches) and 50.8 cm (20 inches). In some implementations, the focal length of each lens 22a-22j is about 40.085 cm (17.75 inches). In some implementations, the focal length of each lens 22a-22j varies, and the housing provides multiple different distances (e.g., those that are greater and/or lesser than dimension 203) between the sheet 201 and the surface 202.

Some implementations of the lenses 22a-22j concentrate incident sunlight to 400 times normal concentration (i.e., 400 Suns) or more. In some implementations, one or more of the lenses 22a-22j concentrates sunlight to about 520 times normal concentration. In some implementations, one or more of the lenses 22a-22j concentrates sunlight to about 470 times normal concentration. Generally speaking, conversion efficiency of solar energy into electricity increases under concentrated illumination. For example, at about 500 Suns, a single solar cell module can generate 10 watts or more of electrical power. In another example, at about 470 Suns or more, a single solar cell module can generate 14 watts or more of electrical power. The amount of electrical power a module can produce can vary depending on, for example, the combination of solar cell characteristics (e.g., size, composition) and properties of the associated optics (e.g., concentration, focus, alignment).

In some implementations, the solar cell 30 of each respective solar cell receiver 12a-12j is a triple-junction III-V solar cell, with each of the three sub-cells arranged in series. In applications where multiple solar cell modules 20 are employed, the receivers 12a-12j of the solar cell modules 20 are typically electrically connected together in series. However, other applications may utilize parallel or series-parallel connection. For example, receivers 12a-12j within a given module 20 can be electrically connected together in series, but the modules 20 are connected to each other in parallel.

Figure 2B:
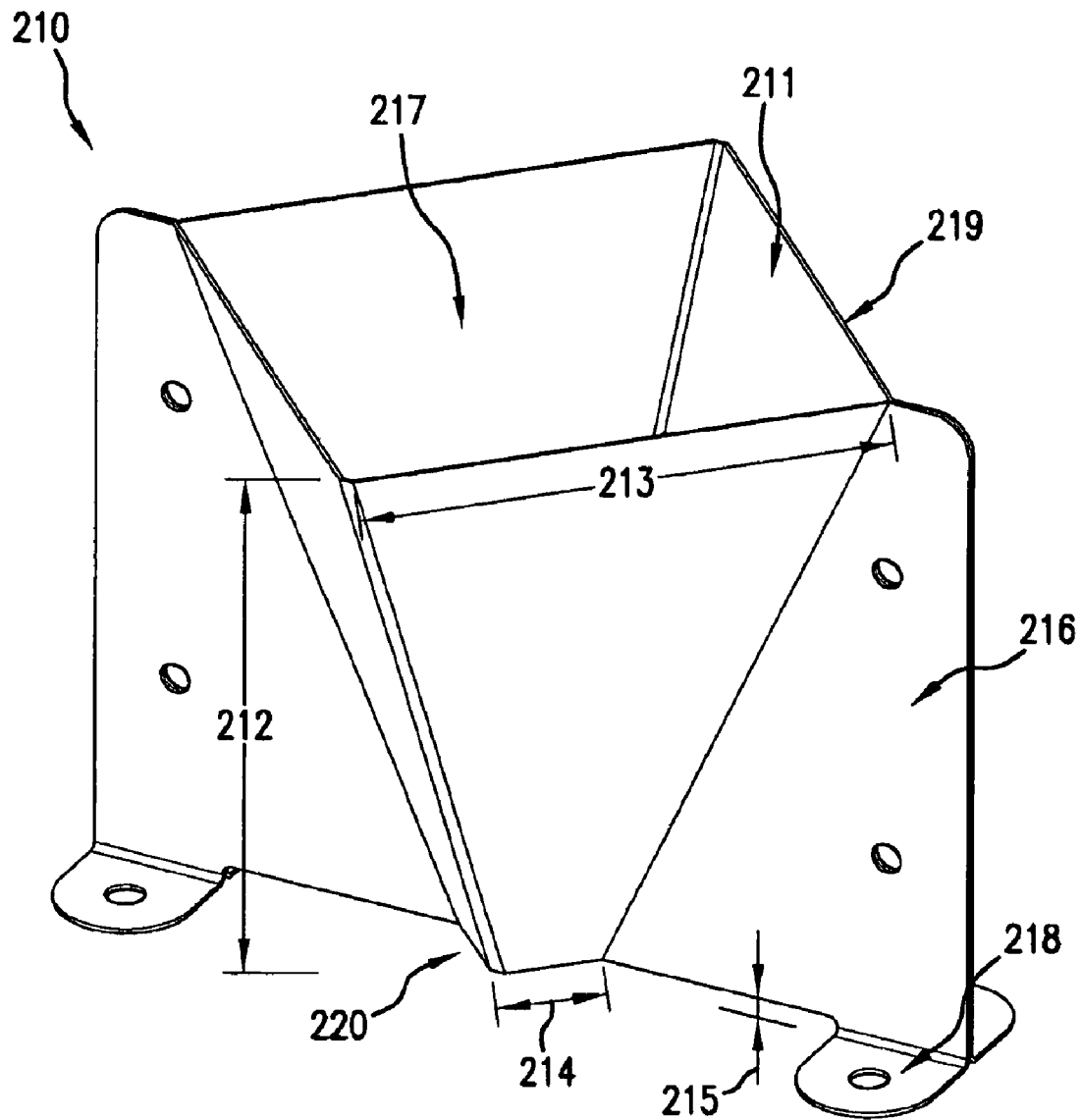
FIG. 2B is a perspective view of an implementation of a secondary optical element.

Some implementations of a solar cell module include a secondary optical element ("SOE"). An implementation of an SOE is illustrated in FIG. 2B. The SOE 210 is disposed inside the housing 21 of the solar cell module 20 and is generally designed to collect solar energy concentrated by an associated lens, e.g., 22b of FIG. 2A. In some implementations, each receiver 12a-12j has a respective SOE.

The SOE 210 comprises an optical element 217 having optical inlet 219 and optical outlet 220, a body 216 and mounting tabs 218. The SOE 210 is mounted such that the optical element 217 is disposed above the solar cell 30 of the solar cell receiver 12 (e.g., 12b of FIG. 2A). While it may vary depending on the implementation, the SOE 210 is mounted such that the optical outlet is about 0.5 millimeters from the solar cell 30 (e.g., dimension 215 is about 0.5 millimeters). In some implementations, mounting tabs 218 couple to face 202 of the solar cell module 20. The SOE 210 (including the body 216) can be made of metal, plastic, or glass or other materials.

In some implementations, the optical element 217 has a generally square cross section that tapers from the inlet 219 to the outlet 220. The inside surface 211 of the optical element reflects light downward toward the outlet 220. The inside surface 211 is, in some implementations, coated with silver or another material for high reflectivity. In some cases, the reflective coating is protected by a passivation coating such as $SiO_2$ to protect against oxidation, tarnish or corrosion. The path from the optical inlet 219 to the optical outlet 220 forms a tapered optical channel that catches solar energy from the primary lens and guides it to the solar cell. As shown in this implementation, the SOE 210 comprises an optical element 217 having four reflective walls. In other implementations, different shapes (e.g., three-sided to form a triangular cross-section) may be employed.

In some cases, the primary lens (e.g., 22b of FIG. 2A) does not focus light on a spot that is of the dimensions of the solar cell 30 or a solar tracking system may not perfectly point to the sun. In these situations, some light does not reach the solar cell 30. The reflective surface 211 directs light to the solar cell 30. The optical element 217 can also homogenize (e.g., mix) light. In some cases, it also has some concentration effect.

In some implementations, the optical inlet 219 is square-shaped and is about 49.60 mm×49.60 mm (dimension 213), the optical outlet is square-shaped and is about 9.9 mm×9.9 mm (dimension 214) and the height of the optical element is about 70.104 mm (dimension 214). The dimensions 214, 213 and 214 may vary with the design of the solar cell module and the receiver. For example, in some implementations the dimensions of the optical outlet are approximately the same as the dimensions of the solar cell. For an SOE having these dimensions, the half inclination angle is 15.8 degrees.

IV. Implementations of a Solar Cell Receiver

Figure 3:
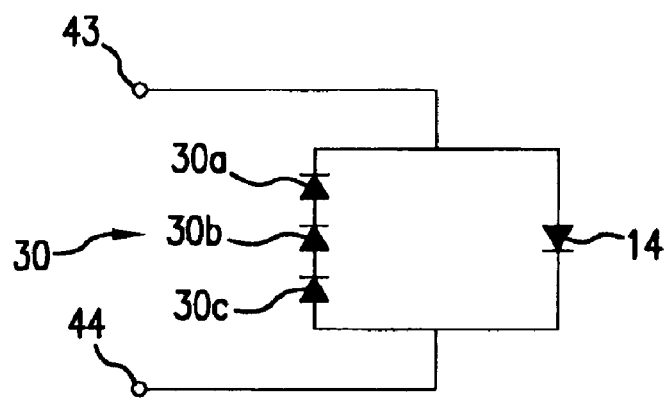
FIG. 3 is a circuit diagram of the solar cell receiver of FIG. 4.

FIG. 3 illustrates the circuit diagram of a solar cell receiver 12 (e.g., 12a of FIG. 2A) of the solar cell module 20. The receiver includes a triple-junction III-V compound semiconductor solar cell 30 which comprises a top cell 30a, a middle cell 30b and a bottom cell 30c arranged in series. When implemented in a solar cell module, the solar cell 30 is positioned to receive focused solar energy from the lens (see FIGS. 2A and 2B).

A diode 14 is connected in parallel with the triple-junction solar cell 30. In some implementations, the diode 14 is a semiconductor device such as a Schottky bypass diode or an epitaxially grown p-n junction. For purposes of illustration, diode 14 is a Schottky bypass diode. External connection terminals 43 and 44 are provided for connecting the solar cell 30 and diode 14 to other devices, e.g., adjacent solar cell receivers. In some implementations, the solar cell 30, the diode 14 and the terminals 43 and 44 are mounted on a board or substrate (see, e.g., item 9 of FIG. 4) which is made of insulating material.

The functionality of the diode 14 can be appreciated by considering multiple solar cell receivers 12 connected in series. Each of the triple junction solar cells 30 can be envisioned as a battery, with the cathode of each of the diodes 14 being connected to the positive terminal of the associated "battery" and the anode of each of the diodes being connected to the negative terminal of the associated "battery." When one of the serially-connected solar cells 30 becomes damaged or shadowed, its voltage output is reduced or eliminated (e.g., to below a threshold voltage associated with the diode 14). Therefore, the associated diode 14 becomes forward-biased, and a bypass current flows only through that diode 14 (and not the solar cell 30). In this manner, the non-damaged or nonshadowed solar cells continue to generate electricity from the solar energy received by those solar cells. If not for the diode 14, substantially all of the electricity produced by the other solar cell receivers 12 will pass through the shadowed or damaged solar cell 30, destroying it, and creating an open circuit within, e.g., the panel or array.

Figure 5:
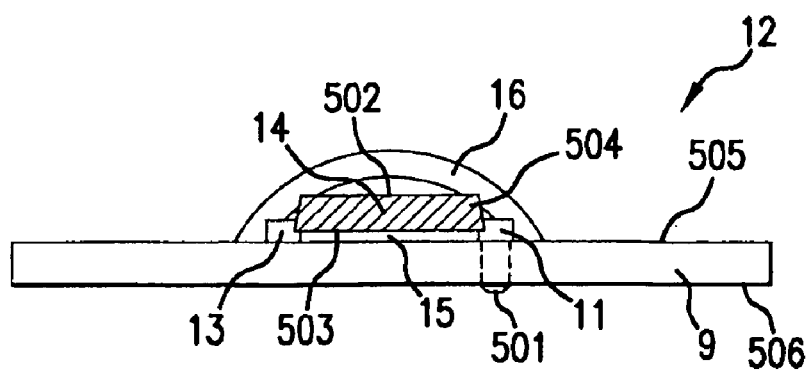
FIG. 5 is a cross-section taken on line A-A of FIG. 4.
Figure 6:
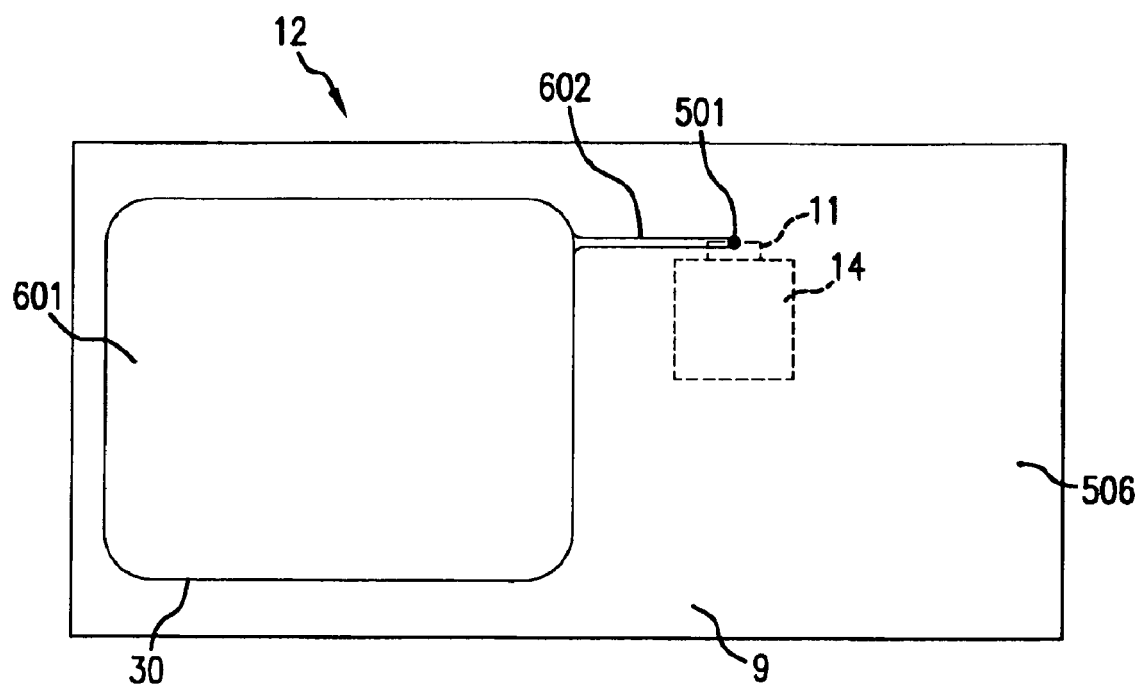
FIG. 6 is a view of the bottom of an implementation of a solar cell receiver.

FIGS. 4, 5 and 6 illustrate one of the receivers 12 that is implemented in FIG. 2A as items 12a-12j. For purposes of this implementation, it is assumed that all of the other receivers in a given array or panel are substantially the same.

FIG. 4 illustrates one solar cell 30 and its associated diode 14. The solar cell 30 is electrically connected to the diode 14. The upper surface of the solar cell 30 comprises a contact area 301 that, in this implementation, occupies the perimeter of the solar cell 30. In some implementations, the contact area 301 is smaller or larger to accommodate the desired connection type. For example, the contact area 301 may touch only one, two or three sides (or portions thereof) of the solar cell 30. In some implementations, the contact area 301 is made as small as possible to maximize the area that converts solar energy into electricity, while still allowing electrical connection. While the particular dimensions of the solar cell 30 will vary depending on the application, standard dimensions are about a 1 cm square. For example, a standard set of dimensions can be about 12.58 mm×12.58 mm overall, about 0.160 mm thick, and a total active area of about 108 mm$^2$. For example, in a solar cell 30 that is approximately 12.58 mm×12.58 mm, the contact area 301 is about 0.98 mm wide and the aperture area is about 10 mm×10 mm. The contact area 301 may be formed of a variety of conductive materials, e.g., copper, silver, and/ or gold-coated silver. In this implementation, it is the n-conductivity side of the solar cell 30 that receives light, and accordingly, the contact area 301 is disposed on the n-conductivity side of the solar cell 30.

An anti-reflective coating 305 may be disposed on the solar cell 30. The anti-reflective coating 305 may be a multi-layer antireflective coating providing low reflectance over a certain wavelength range, e.g., 0.3 to 1.8 μm. An example of an anti-reflective coating is a dual-layer $TiO_x/Al_2O_3$ dielectric stack.

The contact 301 is coupled to a conductor trace 302 that is disposed on the board 9. In this implementation, the contact 301 is coupled to the conductor trace 302 by a plurality (twelve in this example) of wire bonds 304. The number of wire bonds 304 utilized in a particular implementation can be related, among other things, to the amount of current generated by the solar cell 30. Generally, the greater the current, the greater number of wire bonds that are used.

The conductor trace 302 (and hence, the solar cell 30) couples to terminal 11 of the diode 14 by way of an electrical connection between conductor trace 302 and conductor trace 45.

The other terminal 13 of the diode 14 is coupled to trace 46. To complete the parallel connection between the solar cell 30 and the diode 14, terminal 13 is coupled to the underside of the solar cell 30. This is discussed in greater detail in connection with FIGS. 5 and 6.

The diode 14 is electrically coupled to the connector terminals 43 and 44 by way of traces 45 and 46, respectively. The connector terminals 43 and 44 are electrically coupled to sockets 343 and 344, respectively, mounted in the apertures 42 and 41 of connector 40. Sockets 343 and 344 are shown in dotted lines because they are hidden from view by the body of the connector 40. The sockets comprise an electrically conductive material (e.g., copper, silver, gold and/or a combination thereof) and provide for electrical coupling of a device to the circuit. In some implementations, the sockets correspond to anode and cathode terminals, and are designed to accept receptacle plugs 341 and 342 for connection to the adjacent receivers 312, e.g., as described above with reference to FIG. 3. Adjacent receivers 312 may take substantially the same form as receiver 12. The connector 40, is in some implementations, securely attached to the board 9 and may be constructed out of an insulating material (e.g., plastic).

The relatively large connector 40, which defines insulated apertures 41 and 42, helps prevent a solar cell breakdown as a result of electric discharges at the terminals leading to adjacent receivers, owing to the insulated apertures providing an excellent insulation for each of the plug/socket electrical connections housed therein.

As shown in FIG. 5, the diode 14 is mounted above the board 9 on the terminals 11 and 13. Depending on the application, diode 14 may be a surface-mount type. Terminals 11 and 13 couple to anode and cathode of the diode 14, respectively, and thus may be referred to as the anode terminal or cathode terminal of the diode 14. The portions of the diode 14 aside from the terminals 11 and 13 may be referred to as the diode body (i.e., hatched region 504).

In this implementation, diode terminal 11 is coupled electrically to a connector 501 that passes through the board 9 to couple the diode to the bottom surface of the solar cell 30. In some implementations, connector 501 may take the form of pin that is attached to the diode 14, and is mounted using through-hole technology. The connector 501 may vary depending upon how the solar cell 30 is mounted on the board 9. If, for example, the board 9 is constructed so that bottom of the solar cell (e.g., the p-conductivity side) is exposed, the connector 501 may pass through the entire thickness of the board 9. In some implementations, the bottom of solar cell 30 may sit on top of a surface of the board 9. For such implementations, the connector 501 may couple to a layer of the board 9 (e.g., a layer below the top surface 505 of the board 9).

The gap between bottom portion 503 the diode 14 (e.g., the surface(s) that face the board 9) and the board 9 is occupied by any suitable dielectric underfill material 15, so that there is no air gap between the diode and the board. In some implementations, there is no air gap between the contacts 11 and 13 and the underfill 15 occupies substantially all of the space between the bottom portion 503 of the diode 14 and the board 9. In that case, the underfill 15 is in contact with the bottom portion 503 of the diode 14 and the board 9. The underfill 15 also may contact other areas of the diode 14. Examples of suitable underfill materials include silicone. Similarly, a suitable dielectric globtop (or conformal coating) material 16 is deposited over the diode 14 so that the diode is encapsulated. The coating 16 is disposed over the top surface 502 of the diode 14 (e.g., the surface(s) that face away from the board 9) and extends downwardly until it reaches the board 9. The coating 16 thus encapsulates the diode body 504 as well as contacts 11 and 13. The coating 16 contacts the top surface 502 of the diode 14 as well as contacts 11 and 13. The coating 16 may contact other areas of the diode 14. Suitable globtop or conformal coating materials include those sold under the Loctite® brand by the Henkel Corporation. As the dielectric material 15 and 16 has a much higher dielectric strength than air, the risk of dielectric medium breakdown is substantially eliminated. The underfill and globtop dielectric materials 15 and 16 prevent uncontrolled discharge of electricity, and so protect the solar cells 30 of the system.

FIG. 6 depicts the bottom side of the receiver 12. The underside 601 of the solar cell 30 is a conductive (e.g., metallized) surface. The underside 601 may comprise copper, silver, and/or gold coated silver and is coupled to a conductive trace 602. The conductive trace 602 is coupled to connector 501, which is coupled to terminal 11 of the diode 14 (items 11 and 14 are shown in dotted lines because they are hidden in this view). The conductive trace 602 may be relatively wide to carry the current generated by the solar cell 30. In some embodiments, a jumper wire is used instead of, or in combination with, the conductive trace 602.

Depending upon the implementation, the underside 601 of the solar cell 30 may rest upon a surface of the board 9 (e.g., a layer above the bottom surface 506). In other implementations, there may be a cutout in the board 9 that exposes the underside 601 of the solar cell 30. The location of the conductive trace 602 can vary depending on how the solar cell 30 is mounted. For example, if there is a cutout in the board 9, the conductive trace 602 may be on the bottom surface 506 of the board 9. If the solar cell 30 rests upon a layer of the board above the bottom surface 506, the conductive trace 602 may not be on the bottom surface of the board (e.g., it may be disposed on a layer between the top 506 and bottom 506 surfaces of the board 9). In such implementations, the underside 601 of the solar cell and conductive trace 602 could be hidden in this perspective.

V. Second Implementation of a Solar Cell

Figure 7B:
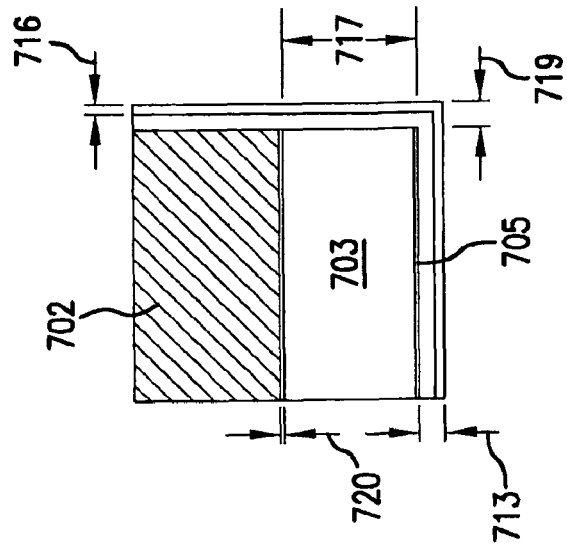
FIGS. 7A, 7B and 7C depict an alternative implementation of a solar cell.
Figure 7C:
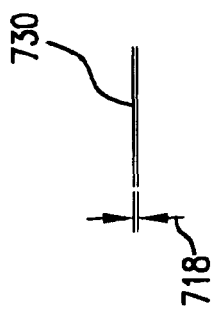
Figure 7A:
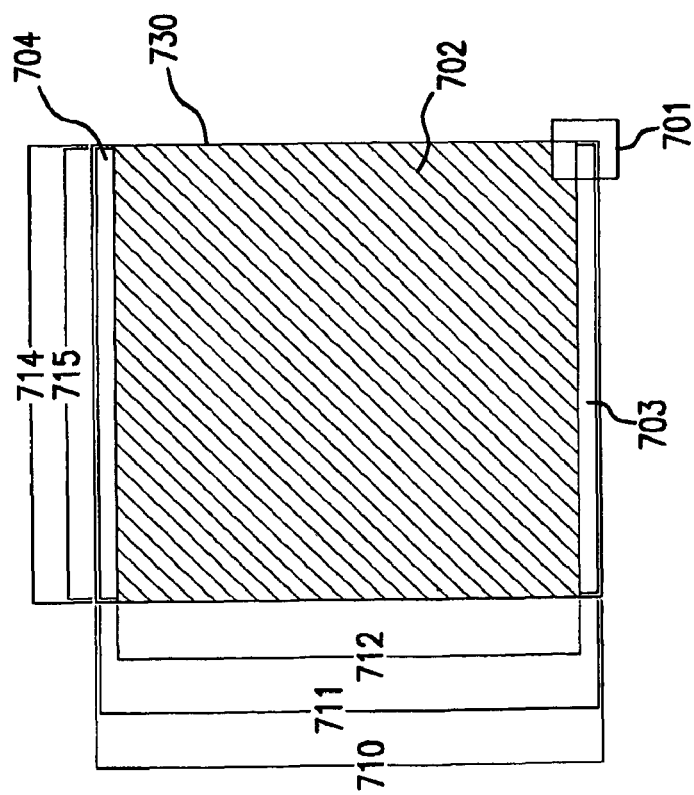

FIGS. 7A, 7B and 7C depict a second implementation of a solar cell 730 for use, for example, in a solar cell receiver such as items 12a-12j of FIG. 2A or item 12 of FIG. 4. Solar cell 730 is a multijunction cell having n-on-p polarity and is composed of InGaP/(In)GaAs III-V compounds on a Ge substrate. The solar cell 730 also includes an anti-reflective coating comprising a dual-layer $TiO_x/Al_2O_3$ dielectric stack, whose spectral reflectivity characteristics are designed to minimize reflection at the coverglass-interconnect-cell (CIC) or solar cell assembly (SCA) level, as well as, maximizing the end-of-life (EOL) performance of the cells. FIGS. 7A and 7B are from the perspective of the n-polarity side.

One difference between this solar cell 730 and the solar cell 30 of FIG. 4 is that cell 730 utilizes two terminals 703 and 704 ("bus bars") rather than the perimeter contact 301 of cell 30. The terminals 703 and 704 are surrounded by a passivated frame 705 (visible in FIG. 7B, a close-up of region 701). The region occupied by the contacts 703 and 704 is not part of the active area 702 (e.g., a region capable of converting solar energy to electricity). One advantage of this implementation is that a large percentage of the overall surface area is the active area 702 because the contacts 703 and 704 occupy just two sides of the cell 730.

The overall dimensions of the cell 730 are about 11.18 mm (dimension 710) by 10.075 mm (dimension 714). The cell 730 is about 0.185 mm thick (dimension 718). The active area 702 is about 10 mm (dimension 712) by 10.075 mm (dimension 714).

The terminals 703 and 704 are about 9.905 mm wide (dimension 715) by 0.505 mm high (dimension 717), and are located about 0.085 mm (dimensions 713 and 719) from the edges of the cell 730. Accordingly, the distance from the outer edge of terminal 703 to the outer edge of terminal 704 is about 11.01 mm (dimension 711). The passivated frame 705 around the terminals 703 and 704 is about 0.01 mm thick (dimension 720). To account for variations in processing (e.g., saw curf), some implementations employ a thin border (e.g., 0.035 mm, dimension 716) around the entire cell 730 where there are substantially no features.

The bottom of cell 730 (i.e., the p-polarity side) is substantially similar to that of cell 30 illustrated in FIG. 6.

VI. Alternative Implementation of a Solar Cell Receiver

Figure 8:
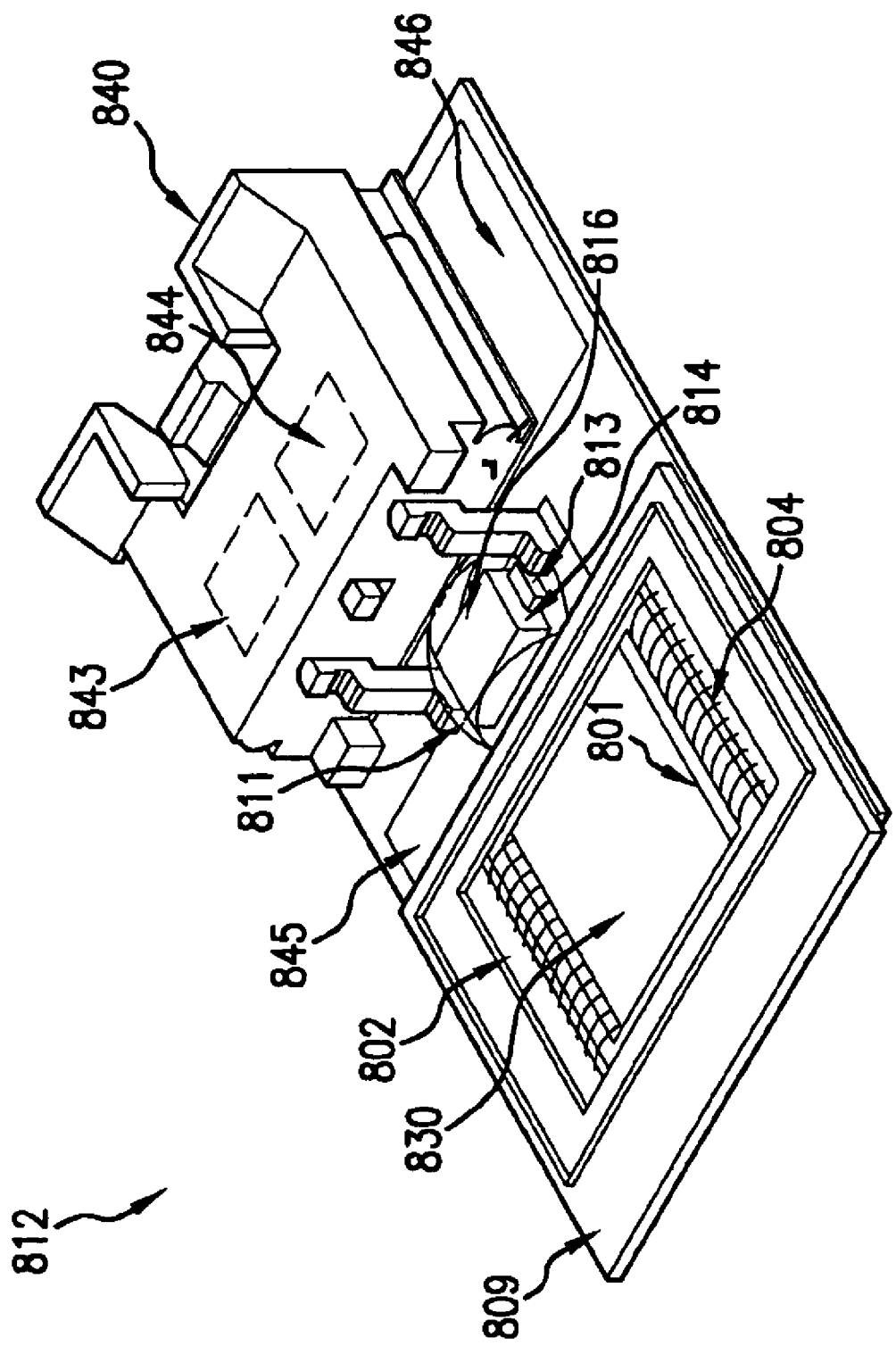
FIG. 8 depicts an alternative implementation of a solar cell receiver.

FIG. 8 illustrates an alternative implementation of a solar cell receiver 812 which comprises solar cell 830 and its associated diode 814. Solar cell receiver 812 can be used in applications in substantially the same manner as receiver 12 of FIG. 4. The solar cell 830 is electrically connected to the diode 814. The upper surface of the solar cell 830 comprises a contact area 801 that, in this implementation, occupies two edges of the solar cell 830. In some implementations, the contact area 801 is made as small as possible to maximize the area that converts solar energy into electricity, while still allowing electrical connection. While the particular dimensions of the solar cell 830 will vary depending on the application, standard dimensions are about a 1 cm square. For example, a standard set of dimensions can be about 12.58 mm×12.58 mm overall, about 0.160 mm thick, and a total active area of about 108 $mm^2$. For example, in a solar cell 830 that is approximately 12.58 mm×12.58 mm, the contact area 801 is about 0.98 mm wide and the aperture area is about 10 mm×10 mm. The contact area 801 may be formed of a variety of conductive materials, e.g., copper, silver, and/or gold-coated silver. In this implementation, it is the n-conductivity side of the solar cell 830 that receives light, and accordingly, the contact area 801 is disposed on the n-conductivity side of the solar cell 830.

An anti-reflective coating may be disposed on the n-conductivity side (or any side that receives solar energy) of the solar cell 830.

The contact 801 is coupled to a conductor trace 802 that is disposed on the board 809. In this implementation, the contact 801 is coupled to the conductor trace 802 by a plurality of wire bonds 804. The number of wire bonds 804 utilized in a particular implementation can be related, among other things, to the amount of current generated by the solar cell 830. Generally, the greater the current, the greater number of wire bonds that are used.

The conductor trace 802 (and hence, the solar cell 830) couples to terminal 811 of the diode 814 by way of an electrical connection between conductor trace 802 and conductor trace 845.

The other terminal 813 of the diode 814 is coupled to trace 846. To complete the parallel connection between the solar cell 830 and the diode 814, terminal 813 is coupled to the underside of the solar cell 830. An example of this type of connection is discussed in connection with FIGS. 5 and 6.

The diode 814 is electrically coupled to the sockets 843 and 844 by way of traces 845 and 846, respectively. The sockets 843 and 844 are electrically insulated from each other by the connector 840. The connector 840 includes apertures for each socket. The apertures are electrically insulated from each other. Sockets 843 and 844 are shown in dotted lines because they are hidden from view by the body of the connector 40. The sockets comprise an electrically conductive material (e.g., copper, silver, gold and/or a combination thereof) and provide for electrical coupling of a device to the circuit. In some implementations, the sockets correspond to anode and cathode terminals, and are designed to accept receptacle plugs (e.g., 341 and 342 of FIG. 4) for connection to the adjacent receivers, e.g., as described with reference to FIG. 3. The connector 840, is in some implementations, securely attached to the board 809 and may be constructed out of an insulating material (e.g., plastic).

The relatively large connector 840 helps prevent a solar cell breakdown as a result of electric discharges at the terminals leading to adjacent receivers, owing to the insulated apertures providing an excellent insulation for each of the plug/socket electrical connections housed therein.

The diode 814 is coated with a globtop dielectric coating 816. Also, a dielectric underfill is placed beneath the diode 814 between the terminals 811 and 813. The use of these materials is discussed in connection with FIG. 5 (e.g., items 15 and 16).

VII. Other Results

In addition to solving the problem of uncontrolled discharge, the use of the underfill and/or globtop (e.g., conformal coating) can result in additional, unexpected, advantages.

Using underfill and/or globtop can substantially improve the ability of a receiver to manage heat dissipation. The underfill and globtop dielectric materials (e.g., 15 and 16) have a higher thermal conductivity than air. Consequently, they improve heat dissipation from the components of the system to the surrounding ambient atmosphere by increasing the cross-section of the thermal path. Moreover, because the underfill and globtop dielectric materials (e.g., 15 and 16) are, in some implementations, in contact with the board or substrate, they facilitate heat transfer from the diode to the board. For example, the underfill 15 and globtop 16 substantially improve the heat dissipation of the diode 14. As described above, when bypassing the solar cell 30, the diode 14 may be carrying several thousand (e.g., 10,000) watts of electrical power. Because diodes are not perfectly efficient electrical conductors, some of that power is dissipated as thermal energy. Excessive thermal energy can destroy the diode, and at a minimum, reduce its service life. As a result, receivers that employ underfill and/or globtop are likely to have increased service life, especially as power levels increase. Moreover, the underfill and/or globtop is a much more cost effective, efficient and lighter solution than many other methods (e.g., passive cooling using metal heat sinks or active cooling) for improving heat management. Moreover, those other methods do not solve the problem of uncontrolled discharge.

The underfill and/or globtop materials can also protect against short circuits resulting from contaminants. In some implementations, the conductor traces (e.g., items 45 and 46) are separated by no more than approximately 1 mm (0.394 inches). When traces are this close to each other, many contaminants, such as a droplet of water, are sufficiently large to contact two adjacent conductor traces. Moreover, as the diode 14 is itself relatively small, it is possible for one or more water droplets to bridge terminals 11 and 13. Since solar receivers (e.g., 12) often are used outdoors, they are exposed to moisture, for example, from condensation and/or rain. The use of the underfill and/or globtop prevents moisture from condensing on the terminals of the diode 14 or on the conductor traces 45 and 46, thereby reducing the probability of short circuits.

The underfill and/or dielectric globtop (or conformal coating) materials 15 and 16 also prevent foreign materials falling onto the terminals of the diodes 14, onto the conductor traces 45 and 46 and onto any electrical traces on the board 9, thereby further reducing the probability of short circuits during operation.

Another unexpected advantage is that the underfill and/or globtop dielectric materials (e.g., 15 and 16) add mechanical integrity to the interfaces between the diodes and the boards to which they are attached. As a result, during transport, installation and handling, the likelihood of the diode becoming detached (or otherwise electrically de-coupled) is reduced.

VIII. Typical Performance Data

Testing implementations of solar cell receivers (e.g., item 12) at different solar concentrations resulted in the following data. The testing at 470 Suns and 1150 Suns involved utilization of the solar cell receiver 12 as part of a solar cell module assembly (e.g., item 20).

|  | 1 Sun | 470 Suns | 1150 Suns |
|---|---|---|---|
| Efficiency | 31.23% | 36.23% | 33.07% |
| $V_{oc}$ (open circuit voltage) | 2.583 V | 3.051 V | 3.078 V |
| $J_{sc}$ (short circuit current) | 13.9 mA/cm$^2$ | 6.49 A/cm$^2$ | 15.92 A/cm$^2$ |
| $V_{mp}$ (voltage at maximum power point) | 2.32 V | 2.704 V | 2.523 V |
| $J_{mp}$ (current at maximum power point) | 13.46 mA/cm$^2$ | 6.27 A/cm$^2$ | 15.04 A/cm$^2$ |
| $P_{mp}$ (maximum power point) | 31.23 mW/cm$^2$ | 17.03 W/cm$^2$ | 38.03 W/cm$^2$ |

As indicated, the testing revealed that efficiency was highest at 470 Suns concentration. Although 1150 Suns produced greater overall output, the greater concentration exposes the solar cell to a greater amount of heat which may damage or substantially shorten the life of the solar cell.

It will be apparent that modifications could be made to the apparatus described above. In particular, the dielectric material could be applied not only to the diodes, but also to all terminals, leads, and conductor traces on the panel. Moreover, the solar cell module housings can be made adjustable, for example, (1) to accommodate lenses having different focal lengths or (2) to increase or decrease concentration (i.e., Suns) by moving the solar cell away from or toward the focal point. Moreover, multiple lenses may be arrayed, for example, to focus incoming light precisely onto the solar cell.

A number of implementations have been described. Nevertheless, it will be understood that various modifications may be made without departing from the spirit and scope of the invention. Accordingly, other implementations are within the scope of the claims.

What is claimed is:

1. A solar cell module for converting solar energy to electricity comprising:
   a housing comprising a first side and a second side opposite to the first side;
   an integral array of Fresnel lenses coupled to the first side of the housing, each lens having a focal length between about 15 inches and about 20 inches;
   a plurality of solar cell receivers disposed on the second side of the housing, each solar cell receiver comprising:
   a solar cell comprising one or more III-V compound semiconductor layers wherein the solar cell has dimensions of about 1 centimeter by about 1 centimeter;
   a diode having a body, an anode terminal and cathode terminal, the diode coupled in parallel with the solar cell;
   a substrate for supporting the solar cell and diode, wherein the diode body comprises a top portion and a bottom portion, the bottom portion being disposed closer to the substrate than the top portion;
   a coating disposed over the top portion of the diode body and extending to the substrate, the coating substantially encapsulating the diode body, anode terminal and cathode terminal;
   an undercoating occupying substantially all of the space between the bottom portion of the diode body and the substrate; and
   first and second electrical terminals coupled in parallel with the solar cell and the diode and adapted to provide electrical connection to one or more spaced apart solar cell receivers; and a plurality of secondary optical elements disposed in the optical path of each respective lens, each secondary optical element defining a respective tapered optical channel having a plurality of reflective walls;

each solar cell being disposed in an optical path of a respective lens and a respective optical channel, wherein the lens is operable to concentrate the solar energy onto the respective solar cell by a factor of 400 or more and generate in excess of 14 watts of peak power.

2. The solar cell module of claim 1 wherein the undercoating is disposed such that there is no air gap between the diode and the substrate.

3. The solar cell module of claim 1 wherein the integral array of Fresnel lenses is an acrylic sheet having an alignment element adapted to couple with an alignment element on the housing.

4. The solar cell module of claim 1 wherein the focal length of the lens is about 17.75 inches.

5. The solar cell module of claim 1 wherein the solar cell is a multifunction cell comprising at least three regions wherein the regions respectively comprise a germanium containing substrate, an InGaAs or GaAs containing layer disposed on the substrate, and a layer of InGaP disposed on the InGaAs or GaAs containing layer.

6. The solar cell module of claim 1 wherein the secondary optical element is a generally trapezoidal solid with a highly reflective inner surface.

7. The solar cell module of claim 1 wherein the optical channel is defined by an optical inlet and an optical outlet, the optical inlet being larger than the optical outlet.

8. The solar cell module of claim 1 wherein the optical outlet is sized to have approximately the same dimensions as the solar cell.

9. A solar cell module for converting solar energy to electricity comprising:

a housing comprising a first side and a second side opposite to the first side;

an alignment frame coupled to the first side of the housing, the alignment frame comprising a plurality of receptacles to couple with an alignment element;

an integral array of fourteen Fresnel lenses disposed on the alignment frame, each lens having a focal length between about 15 inches and about 20 inches, the array comprising seven lenses in a first direction and two lenses in a second direction perpendicular to the first direction;

a plurality of alignment elements to couple the integral array of fourteen Fresnel lenses to the receptacles of the alignment frame;

an array of fourteen solar cell receivers disposed on the second side of the housing, the array of solar cell receivers comprising seven solar cell receivers in a first direction and two solar cell receivers in a second direction perpendicular to the first direction, wherein each solar cell receiver comprises:

a solar cell comprising one or more III-V compound semiconductor layers wherein the solar cell has dimensions of about 1 centimeter by about 1 centimeter;

a diode having a body, an anode terminal and cathode terminal, the diode coupled in parallel with the solar cell;

a substrate for supporting the solar cell and diode, wherein the diode body comprises a top portion and a bottom portion, the bottom portion being disposed closer to the substrate than the top portion;

a coating disposed over the top portion of the diode body and extending to the substrate, the coating substantially encapsulating the diode body, anode terminal and cathode terminal;

an undercoating occupying substantially all of the space between the bottom portion of the diode body and the substrate; and first and second electrical terminals coupled in parallel with the solar cell and the diode and adapted to provide electrical connection to one or more spaced apart solar cell receivers;

wherein the plurality of alignment elements align the integral array of fourteen Fresnel lenses such that each solar cell is disposed in an optical path of a respective lens, wherein the lens is operable to concentrate the solar energy onto the respective solar cell by a factor of 520 or more and generate in excess of 14 watts of peak power.

10. The solar cell module of claim 9 comprising:

an array of fourteen secondary optical elements, each secondary optical element disposed in the optical path of a respective lens, wherein each secondary optical element defines a respective tapered optical channel having a plurality of reflective walls.

11. The solar cell module of claim 10 wherein the solar cell is disposed in an optical path of a respective lens and a respective optical channel.

12. The solar cell module of claim 9 wherein the undercoating is disposed such that there is no air gap between the diode and the substrate.

13. The solar cell module of claim 10 wherein the secondary optical element is a generally trapezoidal solid with a highly reflective inner surface.

14. The solar cell module of claim 10 wherein the optical channel is defined by an optical inlet and an optical outlet, the optical inlet being larger than the optical outlet.

15. The solar cell module of claim 10 wherein the optical outlet is sized to have approximately the same dimensions as the solar cell.

* * * * *

UNITED STATES PATENT AND TRADEMARK OFFICE
CERTIFICATE OF CORRECTION

PATENT NO.        : 8,093,492 B2
APPLICATION NO.   : 12/069642
DATED             : January 10, 2012
INVENTOR(S)       : Gary Hering et al.

It is certified that error appears in the above-identified patent and that said Letters Patent is hereby corrected as shown below:

On the title page, item (75) Inventors, change "Bolle Mead" to --Belle Mead--;

Col. 13, claim 5, line 21, change "multifunction" to --multijunction--.

Signed and Sealed this
Seventeenth Day of April, 2012

David J. Kappos
*Director of the United States Patent and Trademark Office*